US012804967B2

(12) United States Patent
Sung et al.

(10) Patent No.: US 12,804,967 B2
(45) Date of Patent: Nov. 17, 2026

(54) PUNCH THROUGH LEAKAGE CONTROL FOR SEMICONDUCTOR STRUCTURES

(71) Applicant: International Business Machines Corporation, Armonk, NY (US)

(72) Inventors: Min Gyu Sung, Latham, NY (US); Julien Frougier, Albany, NY (US); Ruilong Xie, Niskayuna, NY (US); Juntao Li, Cohoes, NY (US); Chanro Park, Clifton Park, NY (US); Nicolas Jean Loubet, Guilderland, NY (US); Tao Li, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 355 days.

(21) Appl. No.: 18/587,430

(22) Filed: Feb. 26, 2024

(65) Prior Publication Data

US 2025/0275193 A1 Aug. 28, 2025

(51) Int. Cl.

| | |
|---|---|
| ***H10D 62/10*** | (2025.01) |
| ***H10D 84/85*** | (2025.01) |
| ***H10W 10/00*** | (2026.01) |
| ***H10W 10/17*** | (2026.01) |
| *H10D 30/43* | (2025.01) |
| *H10D 30/62* | (2025.01) |
| *H10D 30/67* | (2025.01) |

(52) U.S. Cl.

CPC ........... *H10D 62/112* (2025.01); *H10D 84/85* (2025.01); *H10D 84/853* (2025.01); *H10W 10/0148* (2026.01); *H10W 10/17* (2026.01); *H10D 30/43* (2025.01); *H10D 30/62* (2025.01); *H10D 30/6757* (2025.01)

(58) Field of Classification Search

CPC .... H10D 62/112; H10D 84/85; H10D 84/853; H10D 30/6757; H10D 30/62; H10D 30/43; H10W 10/17; H10W 10/0148

USPC .......................................................... 257/369

See application file for complete search history.

(56) References Cited

U.S. PATENT DOCUMENTS

| | | | | |
|---|---|---|---|---|
| 9,385,189 | B1 | 7/2016 | Sung et al. | |
| 9,741,623 | B2 | 8/2017 | Sung et al. | |
| 10,026,655 | B2 | 7/2018 | Sung et al. | |
| 10,325,818 | B2 | 6/2019 | Li | |
| 11,404,560 | B2 | 8/2022 | Basker et al. | |
| 11,810,827 | B2 | 11/2023 | Cheng et al. | |
| 2010/0060758 | A1* | 3/2010 | Oshiyama | H10F 39/807 257/E31.11 |
| 2018/0342426 | A1* | 11/2018 | Feng | H10D 84/0193 |
| 2022/0310602 | A1 | 9/2022 | Greene et al. | |
| 2025/0169090 | A1* | 5/2025 | Jang | H10D 30/024 |
| 2025/0220946 | A1* | 7/2025 | Chou | H10D 30/43 |

* cited by examiner

*Primary Examiner* — Tu-Tu V Ho

(74) *Attorney, Agent, or Firm* — Kimberly Zillig; Ryan, Mason & Lewis, LLP

(57) ABSTRACT

A semiconductor structure includes a semiconductor layer, one or more channel layers disposed over the semiconductor layer, a first dielectric liner surrounding sidewalls of a first region of the semiconductor layer proximate the one or more channel layers, a second dielectric liner surrounding sidewalls of a second region of the semiconductor layer below the first region of the semiconductor layer, and a shallow trench isolation region surrounding the first dielectric liner and the second dielectric liner, where the first dielectric liner and the second dielectric liner are different materials.

20 Claims, 18 Drawing Sheets

PUNCH THROUGH LEAKAGE CONTROL FOR SEMICONDUCTOR STRUCTURES

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

A field-effect transistor (FET) is a three-terminal device having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Various techniques may be used to reduce the area of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In FinFET arrangements, the gate encloses three surfaces of the three-dimensional channel, rather than being disposed over just the top surface of a traditional planar channel.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm node and beyond. A general process flow for formation of a nanosheet stack involves removing sacrificial layers, which may be formed of Silicon Germanium (SiGe), between sheets of channel material, which may be formed of Silicon (Si).

SUMMARY

Embodiments of the invention provide techniques for forming semiconductor structures with punch through leakage control achieved through the use of different dielectric liners on different regions of sidewalls of semiconductor layers which are surrounded by shallow trench isolation regions.

In one embodiment, a semiconductor structure includes a semiconductor layer, one or more channel layers disposed over the semiconductor layer, a first dielectric liner surrounding sidewalls of a first region of the semiconductor layer proximate the one or more channel layers, a second dielectric liner surrounding sidewalls of a second region of the semiconductor layer below the first region of the semiconductor layer, and a shallow trench isolation region surrounding the first dielectric liner and the second dielectric liner, where the first dielectric liner and the second dielectric liner are different materials.

In another embodiment, a semiconductor structure includes a first semiconductor layer, one or more first channel layers for an n-type transistor device disposed over the first semiconductor layer, a second semiconductor layer, one or more second channel layers for a p-type transistor device disposed over the second semiconductor layer, a first dielectric liner surrounding sidewalls of a first region of the first semiconductor layer proximate the one or more first channel layers, a second dielectric liner surrounding sidewalls of a first region of the second semiconductor layer proximate the one or more second channel layers, a third dielectric liner surrounding sidewalls of second regions of the first and second semiconductor layers below the first regions of the first and second semiconductor layers, and a shallow trench isolation region surrounding the first dielectric liner, the second dielectric liner and the third dielectric liner, where the first dielectric liner and the third dielectric liner are different materials.

In another embodiment, an integrated circuit includes a semiconductor structure including a semiconductor layer, one or more channel layers disposed over the semiconductor layer, a first dielectric liner surrounding sidewalls of a first region of the semiconductor layer proximate the one or more channel layers, a second dielectric liner surrounding sidewalls of a second region of the semiconductor layer below the first region of the semiconductor layer, and a shallow trench isolation region surrounding the first dielectric liner and the second dielectric liner, where the first dielectric liner and the second dielectric liner are different materials.

DETAILED DESCRIPTION

Illustrative embodiments of the invention may be described herein in the context of illustrative methods for forming semiconductor structures with punch through leakage control, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Figure 1:
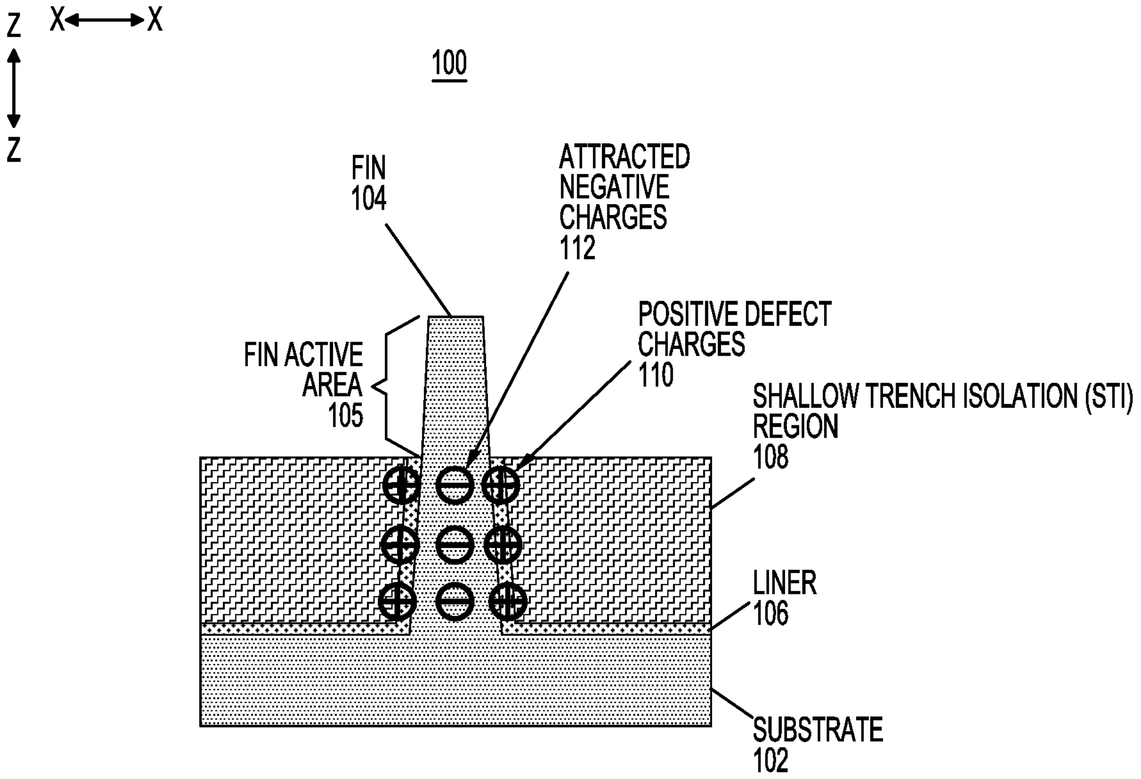
FIG. 1 depicts a cross-sectional view of a semiconductor structure including a liner layer surrounding a fin region, where the liner layer includes positive defect charges which attract negative charges in the fin region, according to an embodiment of the invention.

As described above, the use of fins or stacked nanosheet channels provide techniques useful for reducing the size of field-effect transistors (FETs). A general process flow for formation of such fin-type FET (FinFET) or nanosheet FET structures includes formation of shallow trench isolation (STI) regions below an active area of the fins or a nanosheet stack. A liner layer (e.g., formed of silicon nitride (SiN) or another suitable material) may be formed to prevent oxidation of the active area during fill of material for the STI regions. This is illustrated in FIG. 1, which shows a cross-sectional view 100 of a semiconductor structure including a substrate 102, a fin 104, a liner 106 surrounding the fin below an active area 105 of the fin 104, and an STI region 108 surrounding the liner 106 below the active area 105 of the fin 104. The substrate 102 and the fin 104 are formed of silicon (Si), the liner 106 is formed of SiN, and the STI region 108 is formed of silicon dioxide ($SiO_2$).

As shown in FIG. 1, the liner 106 includes positive defect charges 110, which lead to attracted negative charges 112 in the fin 104 below the active area 105. The positive defect charges 110 are inherent in SiN, and result in the attracted negative charges 112 towards the middle of the fin 104 below the active area 105 (e.g., providing a channel region for a FET). The attracted negative charges 112 prevent punch through leakage by punch through stop (PTS) implantation, and degrade device performance. To address these issues, some embodiments form an additional liner layer (e.g., formed of $SiO_2$, doped $SiO_2$, etc.) which is located between the liner 106 (e.g., formed of SiN) and a portion of the fin 104 which is proximate to one or more channels for a transistor device, thus increasing the distance between the liner 106 and the one or more channels such that less negative charge is attracted in the fin 104. This provides benefits for PTS control, particularly for n-type transistors (NFETs). For p-type transistors (PFETs), the additional liner may not be used for better PTS control. In other embodiments, the additional liner layer (e.g., formed of undoped $SiO_2$) is formed in the PTS implant area for both NFETs and PFETs to provide improved PTS control. In still other embodiments, a first additional liner (e.g., formed of doped $SiO_2$ with a negative charge, such as a borosilicate glass (BSG) material) is formed in the PTS implant area for NFETs and a second additional liner (e.g., formed of doped $SiO_2$ with a positive charge, such as a phosphosilicate glass (PSG) material) is formed in the PTS implant area for PFETs.

For a FinFET device, a semiconductor structure may include a fin having a first (e.g., top) region providing a channel for a FinFET device, with the first region being directly above a second (e.g., bottom) region. The second region is surrounded by an STI region. The first region of the fin may be formed of Si or silicon germanium (SiGe), while the second region of the fin may be formed of Si. A first dielectric is in direct contact with a first portion of sidewalls of the second region of the fin (e.g., proximate the first region of the fin), and a second dielectric is in direct contact with a second portion of the sidewalls of the second region of the fin (e.g., below the first portion of the sidewalls of the second region of the fin). The second dielectric may be spaced vertically away from the first region of the fin (e.g., by 20 nanometers (nm) or more). The first dielectric may be doped with boron (B) or phosphorous (P), depending on the type of FinFET device being formed.

For a nanosheet FET device, a semiconductor structure may include a nanosheet stack which is directly above a fin. The nanosheet stack includes one or more nanosheet channel layers (e.g., formed of Si or SiGe) which are surrounding by a gate dielectric layer and a gate conductor layer (e.g., a work function metal (WFM) layer), while the fin below the nanosheet stack is formed of Si. The fin is surrounded by an STI region. A first dielectric is in direct contact with a first portion of sidewalls of the fin (e.g., proximate the nanosheet stack), and a second dielectric is in direct contact with a second portion of the sidewalls of the fin (e.g., below the first portion of the sidewalls of the fin). The second dielectric may be spaced vertically away from the nanosheet stack (e.g., by 20 nanometers (nm) or more). The first dielectric may be doped with boron (B) or phosphorous (P), depending on the type of nanosheet FET device being formed.

According to an aspect of the invention, a semiconductor structure includes a semiconductor layer, one or more channel layers disposed over the semiconductor layer, a first dielectric liner surrounding sidewalls of a first region of the semiconductor layer proximate the one or more channel layers, a second dielectric liner surrounding sidewalls of a second region of the semiconductor layer below the first region of the semiconductor layer, and an STI region surrounding the first dielectric liner and the second dielectric liner, where the first dielectric liner and the second dielectric liner are different materials. Advantageously, the first dielectric liner improves punch through leakage control for the semiconductor structure.

In embodiments, the first dielectric liner, the second dielectric liner and the STI region are different materials. This advantageously allows for forming the first dielectric liner of a material that is selected for the type of transistor devices that are to be formed.

In embodiments, the first dielectric liner and the STI region are the same material. This advantageously allows for forming the first dielectric liner of the same material for both p-type and n-type transistor devices that are to be formed.

In embodiments, the first dielectric liner is $SiO_2$ and the second dielectric liner is SiN. The first dielectric liner may be doped $SiO_2$. Where the at least one channel layer is for an n-type transistor device, the first dielectric liner may be doped $SiO_2$ having a negative charge, such as BSG. Where the at least one channel layer is for a p-type transistor device, the first dielectric liner may be doped $SiO_2$ having a positive charge, such as PSG. Advantageously, this allows for tuning the material of the first dielectric liner for improved punch through leakage control depending on the type of transistor devices that are to be formed.

In embodiments, the first region of the semiconductor layer is a PTS region.

In some embodiments, the one or more channel layers are nanosheet channel layers for a nanosheet transistor device. In other embodiments, the one or more channel layers include a fin channel for a FinFET device.

According to an aspect of the invention, a semiconductor structure includes a first semiconductor layer, one or more first channel layers for an n-type transistor device disposed over the first semiconductor layer, a second semiconductor layer, one or more second channel layers for a p-type transistor device disposed over the second semiconductor layer, a first dielectric liner surrounding sidewalls of a first region of the first semiconductor layer proximate the one or more first channel layers, a second dielectric liner surrounding sidewalls of a first region of the second semiconductor layer proximate the one or more second channel layers, a third dielectric liner surrounding sidewalls of second regions of the first and second semiconductor layers below the first regions of the first and second semiconductor layers, and an STI region surrounding the first dielectric liner, the second dielectric liner and the third dielectric liner, where the first dielectric liner and the third dielectric liner are different materials. Advantageously, the first and second dielectric liners improve punch through leakage control for the semiconductor structure, including tuning the punch through leakage control in different areas or regions of the semiconductor structure where different types of transistor devices are to be formed.

In embodiments, the first dielectric liner and the second dielectric liner are different materials. This advantageously allows for tuning the punch through leakage control in different areas or regions of the semiconductor structure where different types of transistor devices are to be formed.

In embodiments, the first dielectric liner and the second dielectric liner are the same material. This advantageously allows for punch through leakage control with simplified fabrication of the structure.

In embodiments, the first dielectric liner and the second dielectric liner are $SiO_2$, and the third dielectric liner is SiN.

According to an aspect of the invention, an integrated circuit includes a semiconductor structure including a semiconductor layer, one or more channel layers disposed over the semiconductor layer, a first dielectric liner surrounding sidewalls of a first region of the semiconductor layer proximate the one or more channel layers, a second dielectric liner surrounding sidewalls of a second region of the semiconductor layer below the first region of the semiconductor layer, and an STI region surrounding the first dielectric liner and the second dielectric liner, where the first dielectric liner and the second dielectric liner are different materials. Advantageously, the first dielectric liner improves punch through leakage control for the semiconductor structure.

In embodiments, the first dielectric liner, the second dielectric liner and the STI region are different materials. This advantageously allows for forming the first dielectric liner of a material that is selected for the type of transistor devices that are to be formed.

In embodiments, the first dielectric liner and the STI region are the same material. This advantageously allows for forming the first dielectric liner of the same material for both p-type and n-type transistor devices that are to be formed.

In embodiments, the first dielectric liner is $SiO_2$ and the second dielectric liner is SiN. Advantageously, this allows for tuning the material of the first dielectric liner for improved punch through leakage control depending on the type of transistor devices that are to be formed.

FIGS. 2-14B show a process flow for forming semiconductor structures with punch through leakage control.

Figure 2:
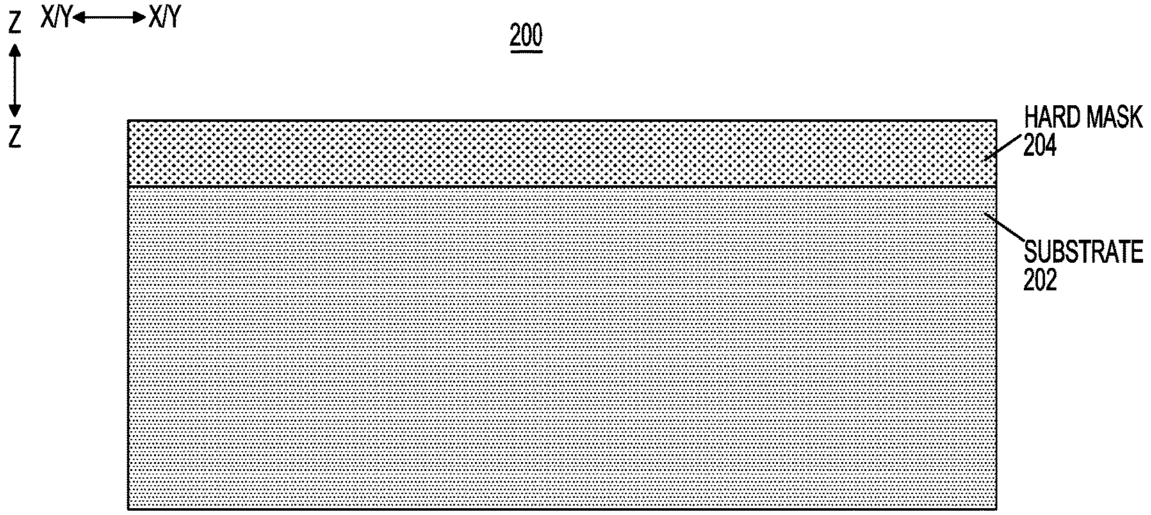
FIG. 2 depicts a cross-sectional view of semiconductor structure including a substrate and a hard mask formed over the substrate, according to an embodiment of the invention.

FIG. 2 shows a cross-sectional view 200 of a semiconductor structure, including a substrate 202 and a hard mask 204 formed over the substrate 202.

The substrate 202 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. The substrate 202 may have a height (in direction Z) and widths (in directions X/Y) which vary as needed based on the type of structures to be formed.

The hard mask 204 may be formed of SiN or another suitable material such as silicon oxycarbide (SiOC), silicon oxycarbonitride (SiOCN). The hard mask 204 may have a height (in direction Z) in the range of 10 to 100 nm.

Figure 3:
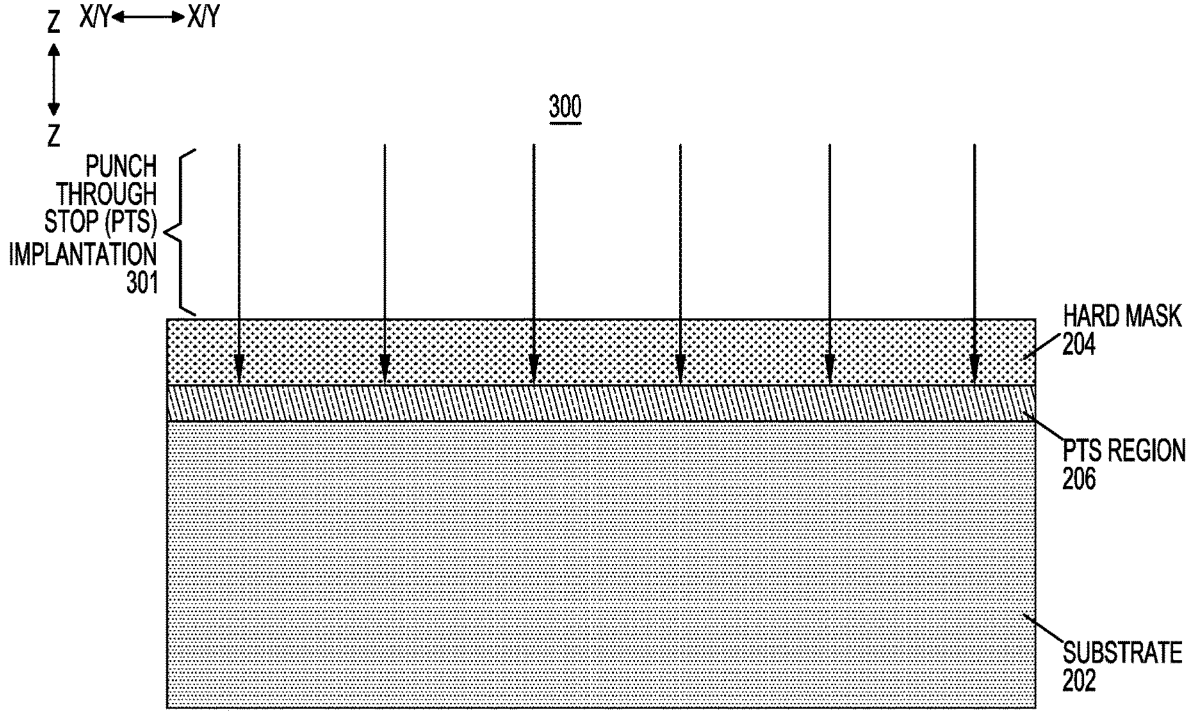
FIG. 3 depicts a cross-sectional view of the structure of FIG. 2 following punch through stop implantation which forms a punch through stop region in the substrate, according to an embodiment of the invention.

FIG. 3 shows a cross-sectional view 300 of the structure of FIG. 2 following punch through stop (PTS) implantation 301, which forms a PTS region 206 in the substrate 202. The PTS implantation 301 includes implantation of ions with an energy less than 10 kiloelectron volts (keV) and a concentration in the range of 1E16 to 1E20/$cm^3$. The PTS region 206 may have a height (in direction Z) in the range of 5 to 20 nm. The type of ions will depend on whether NFET or PFET devices are to be formed in a particular area. In areas or regions of the semiconductor structure where NFET devices are to be formed, the ions may include boron (B), boron fluoride ($BF_2$), etc. In areas or regions of the semiconductor structure where PFET devices are to be formed, the ions may include phosphorus (P), arsenic (As), etc. Thus, in embodiments where both NFET and PFET devices are to be formed in the semiconductor structure, different PTS implantation processes are performed. When performing PTS implantation in the areas or regions where NFET devices are to be formed, the areas or regions where PFET devices are to be formed may be masked, and vice versa.

Figure 4:
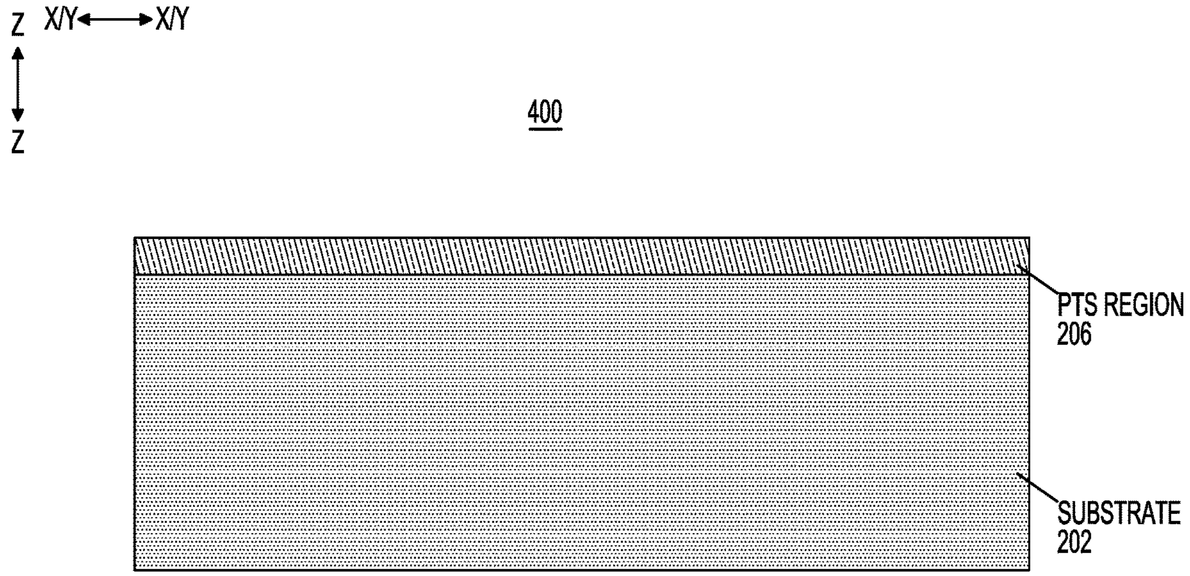
FIG. 4 depicts a cross-sectional view of the structure of FIG. 3 following removal of the hard mask, according to an embodiment of the invention.

FIG. 4 shows a cross-sectional view 400 of the structure of FIG. 3 following removal of the hard mask 204. The hard mask 204 may be removed using a hot phosphoric acid ($H_3PO_4$) etch.

In the process flow of FIGS. 5-14B, formation of nanosheet transistor devices is shown. It should be appreciated, however, that similar processing may be used for forming FinFET transistor devices, where the nanosheet stack is replaced with just a single channel layer from which fins are formed.

Figure 5:
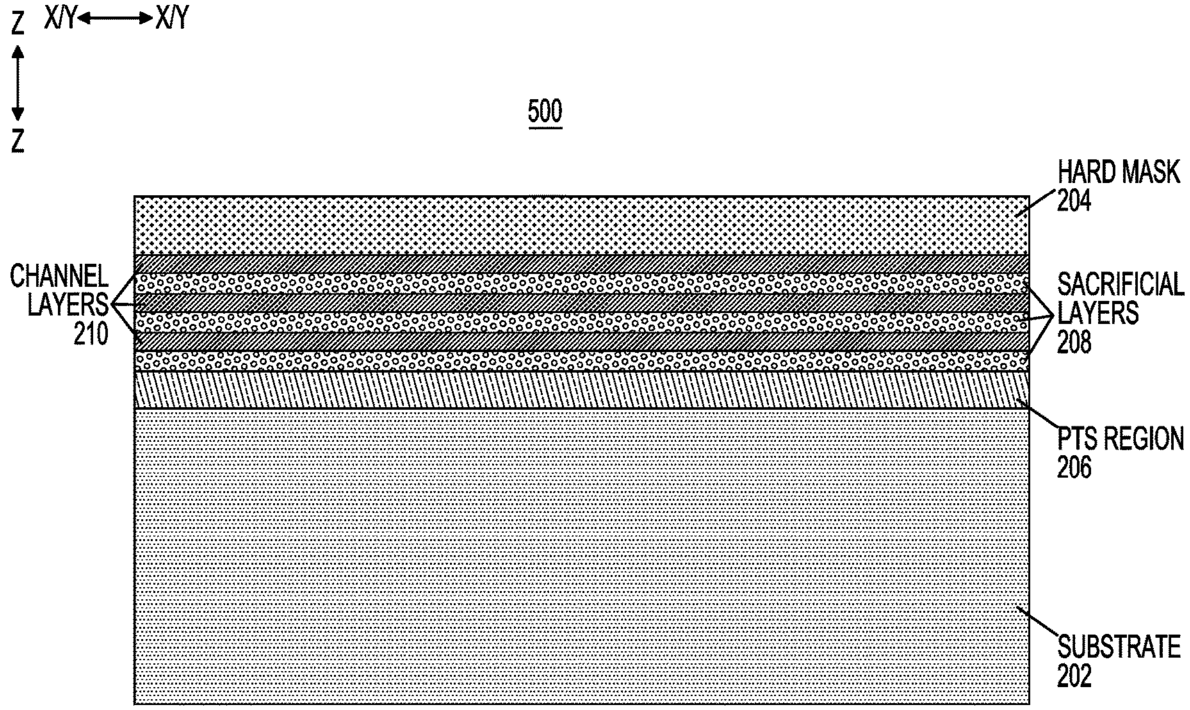
FIG. 5 depicts a cross-sectional view of the structure of FIG. 4 following formation of a nanosheet stack including alternating sacrificial and channel layers, and following formation of a hard mark over the nanosheet stack, according to an embodiment of the invention.

FIG. 5 shows a cross-sectional view 500 of the structure of FIG. 4 following formation of a nanosheet stack over the structure, the nanosheet stack including alternating sacrificial layers 208 and channel layers 210, and following formation of a hard mask 212 over the nanosheet stack.

The sacrificial layers 208 may be formed of SiGe, or another material which may be removed selective to that of the channel layers 210. Each of the sacrificial layers 208 may have a thickness or height (in direction Z) in the range of 5-15 nm.

The channel layers 210 will provide channels for nanosheet transistor devices, and may be formed of Si or another suitable material (e.g., a material similar to that used for the substrate 102). Each of the channel layers 210 may have a thickness or height (in direction Z) in the range of 5-15 nm.

The hard mask 212 may be formed of SiN or another suitable material such as SiOC, SiOCN, etc. The hard mask 212 may have a height (in direction Z) in the range of 10 to 100 nm.

Figure 6:
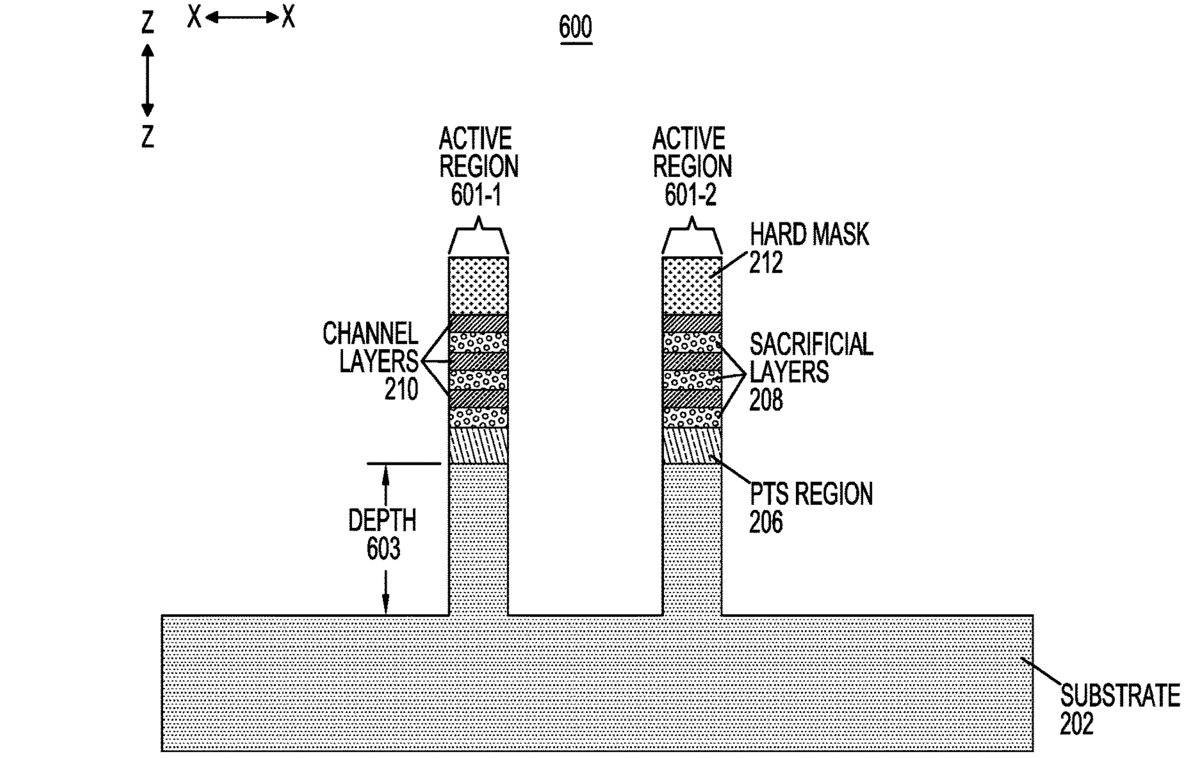
FIG. 6 depicts a cross-sectional view of the structure of FIG. 5 following patterning of active regions in the nanosheet stack and partially through the underlying substrate, according to an embodiment of the invention.

FIG. 6 shows a cross-sectional view 600 of the structure of FIG. 5 following patterning of active regions 601-1 and 601-2 (collectively, active region 601). To pattern the active regions 601, the hard mask 212 is patterned (e.g., using lithography processing). Portions of the nanosheet stack, the PTS region 206 and the underlying substrate 202 which are exposed by the patterned hard mask 212 are then etched through (e.g., using reactive-ion etching (RIE) or other suitable processing). The etching is performed to a depth 603 in the substate 202 below the PTS region 206, where the depth 603 may be in the range of 5 to 20 nm. Each of the active regions 601 may have a width (in direction X) in the range of 10 to 100 nm. Although just two active regions 601 are shown in FIG. 6 for clarity of illustration, this is not a requirement. More or fewer than two active regions may be patterned as desired.

Figure 7:
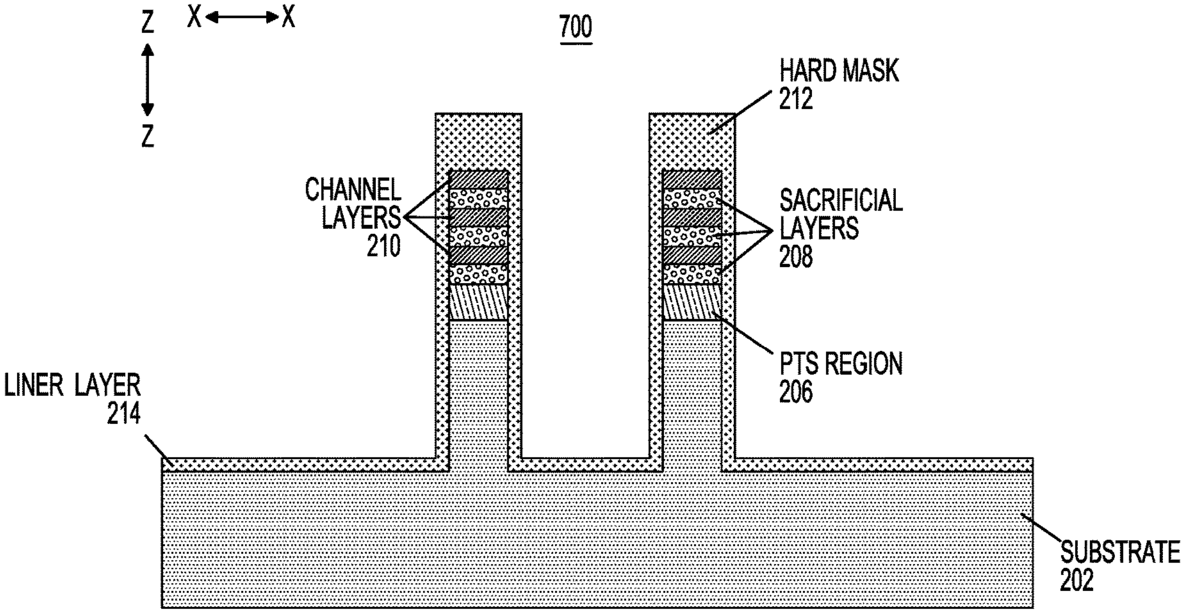
FIG. 7 depicts a cross-sectional view of the structure of FIG. 6 following deposition of a liner layer, according to an embodiment of the invention.

FIG. 7 shows a cross-sectional view 700 of the structure of FIG. 6 following deposition of a liner layer 214. The liner layer 214 may be formed of SiN or another suitable material such as silicoboron carbonitride (SiBCN). The liner layer 214 may have a thickness in the range of 3 to 10 nm.

Figure 8:
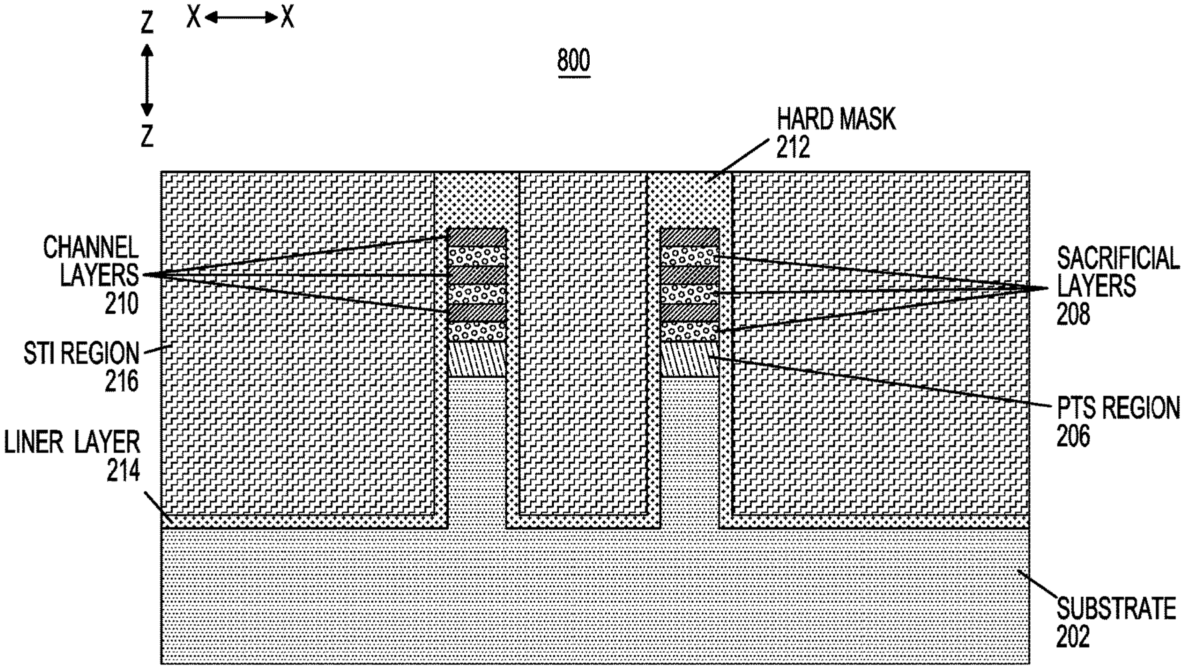
FIG. 8 depicts a cross-sectional view of the structure of FIG. 7 following formation of a shallow trench isolation region, according to an embodiment of the invention.

FIG. 8 shows a cross-sectional view 800 of the structure of FIG. 7 following formation of STI region 216. Material for the STI region 216 may be filled, followed by planarization (e.g., using chemical mechanical planarization (CMP) or other suitable processing). The STI region 216 may be formed of a dielectric material such as $SiO_2$, silicon oxycarbide (SiOC), silicon oxynitride (SiON), etc.

Figure 9:
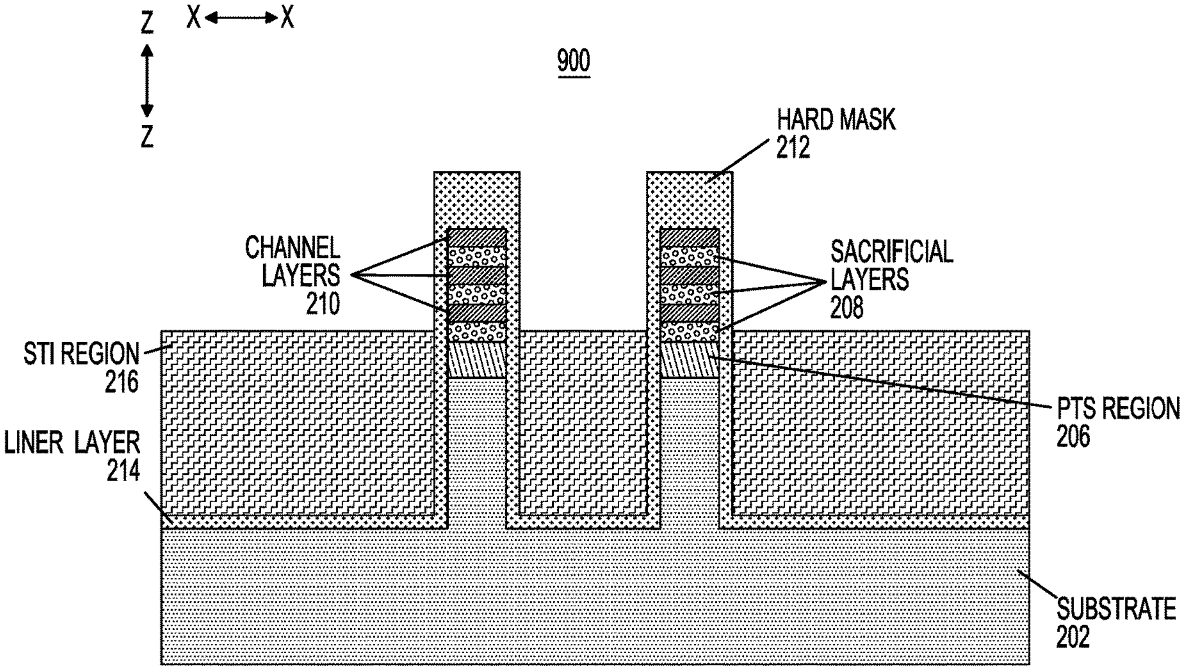
FIG. 9 depicts a cross-sectional view of the structure of FIG. 8 following recess of the shallow trench isolation region, according to an embodiment of the invention.

FIG. 9 shows a cross-sectional view 900 of the structure of FIG. 8 following recess of the STI region 216. The STI region 216 is recessed below a bottommost one of the channel layers 210. The STI region 216 may be recessed using an isotropic dry etch process, or a wet etch process using buffered hydrofluoric acid (BHF).

Figure 10:
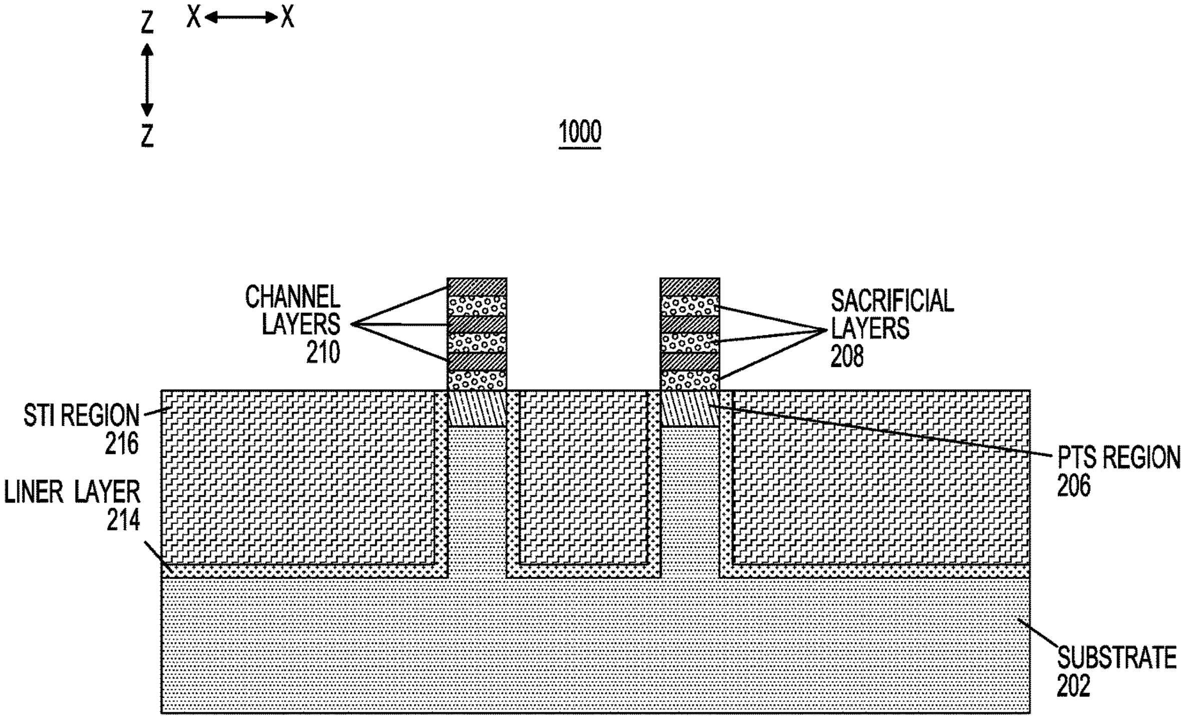
FIG. 10 depicts a cross-sectional view of the structure of FIG. 9 following removal of exposed portions of the liner layer, according to an embodiment of the invention.

FIG. 10 shows a cross-sectional view 1000 of the structure of FIG. 9 following removal of exposed portions of the liner layer 214 and the hard mask 212. The exposed portions of the liner layer 214 (e.g., portions above the STI region 216) and the hard mask 212 may be removed using any suitable etch processing, such as a hot phosphoric acid ($H_3PO_4$) etch.

Figure 11A:
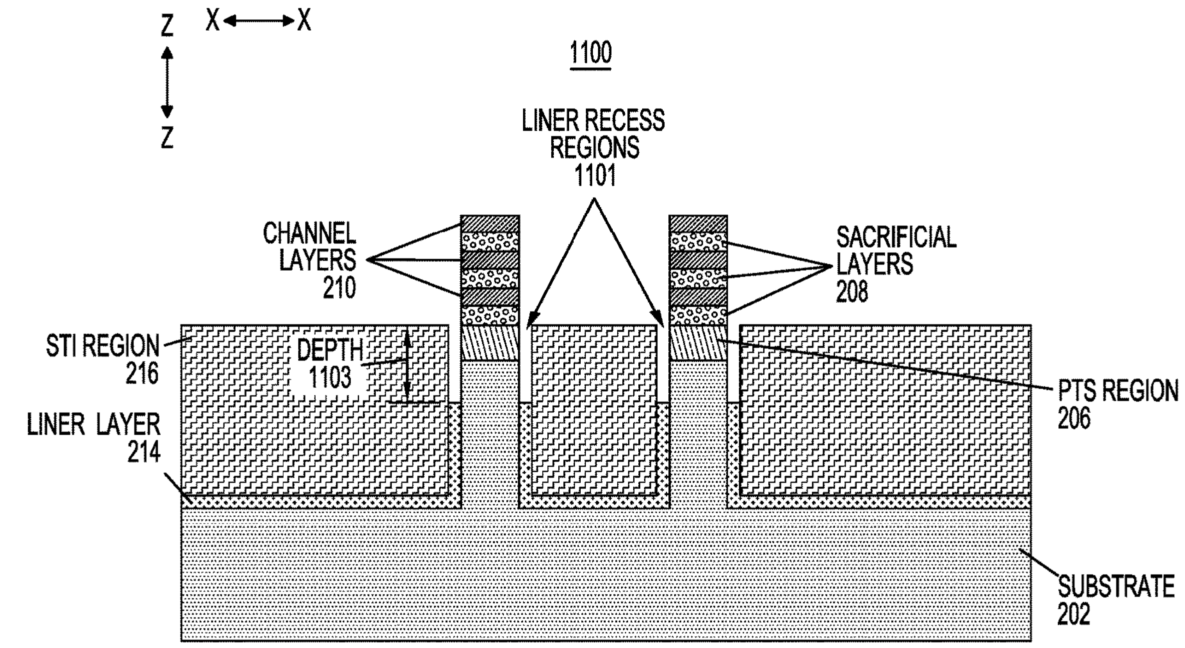
FIG. 11A depicts a first cross-sectional view of the structure of FIG. 10 following a directional recess of the liner layer in a first region, according to an embodiment of the invention
Figure 11B:
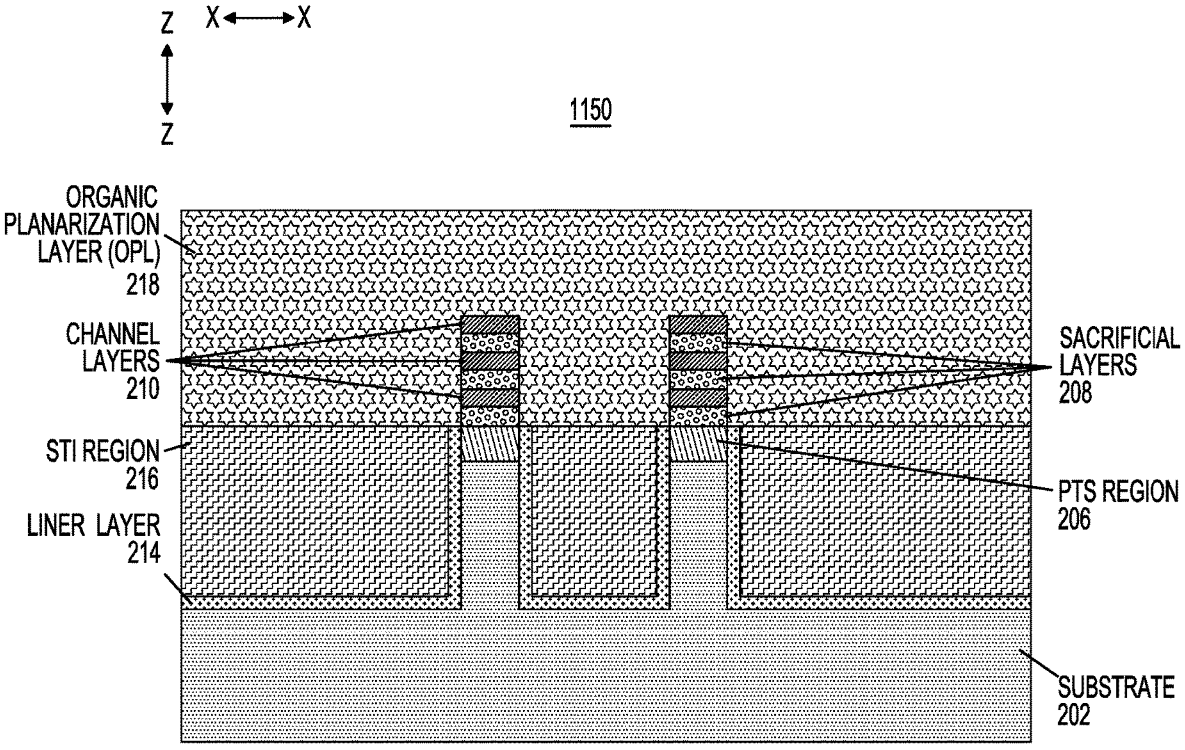
FIG. 11B depicts a second cross-sectional view of the structure of FIG. 10 following formation of an organic planarization layer in a second region, according to an embodiment of the invention.

FIGS. 11A and 11B show first and second cross-sectional views 1100 and 1150 of the structure of FIG. 10, following a directional recess of the liner layer 214 in a "first region" (shown in FIG. 11A) while a "second region" (shown in FIG. 11B) is covered by an organic planarization layer (OPL) 218. The OPL 218 is patterned over the structure of FIG. 10, in order to protect the liner layer 214 from being removed in the second region. In some embodiments, the first region is where NFET devices will be formed, and the second region is where PFET devices will be formed. Once the OPL 218 is patterned, a directional recess of the liner layer 214 is performed to a depth 1103 as illustrated in FIG. 11A. The depth 1103 may be 20 nm or more, and exceeds the height of the PTS region 206.

Figure 12A:
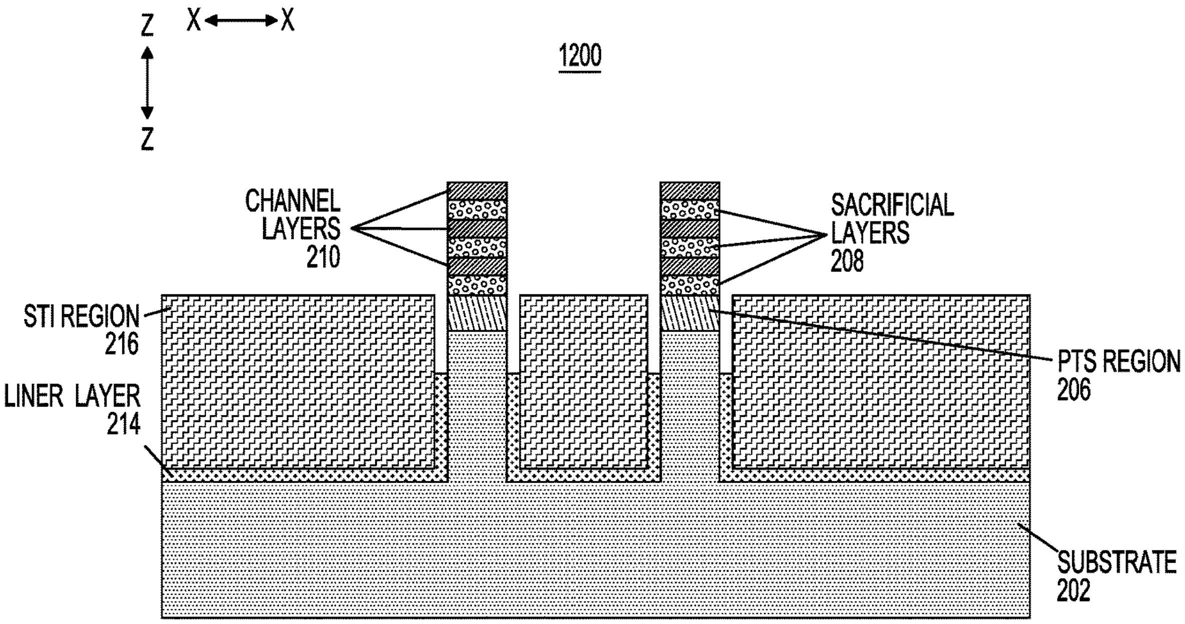
FIG. 12A depicts a first cross-sectional view of the structure FIGS. 11A and 11B following removal of the organic planarization layer from the second region, according to an embodiment of the invention.
Figure 12B:
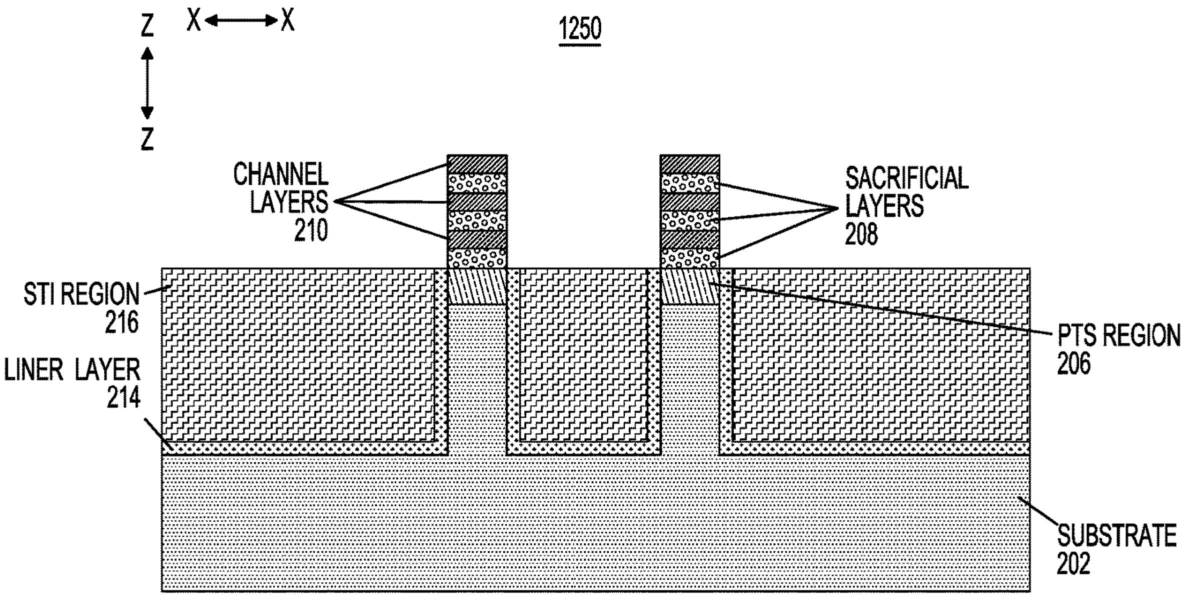
FIG. 12B depicts a second cross-sectional view of the structure of FIGS. 11A and 11B following the removal of the organic planarization layer from the second region, according to an embodiment of the invention.

FIGS. 12A and 12B show first and second cross-sectional views 1200 and 1250 of the structure of FIGS. 11A and 11B following removal of the OPL 218. The resulting structure, has the liner layer 214 removed from the sidewalls of the PTS region 206 and at least a portion of the underlying fins in the substrate 202 in the first region (e.g., where NFET devices will be formed) as shown in FIG. 12A, while the liner layer 214 remains on sidewalls of the PTS region 206 and the underlying fins in the substrate 202 in the second region (e.g. where PFET devices will be formed).

Figure 13A:
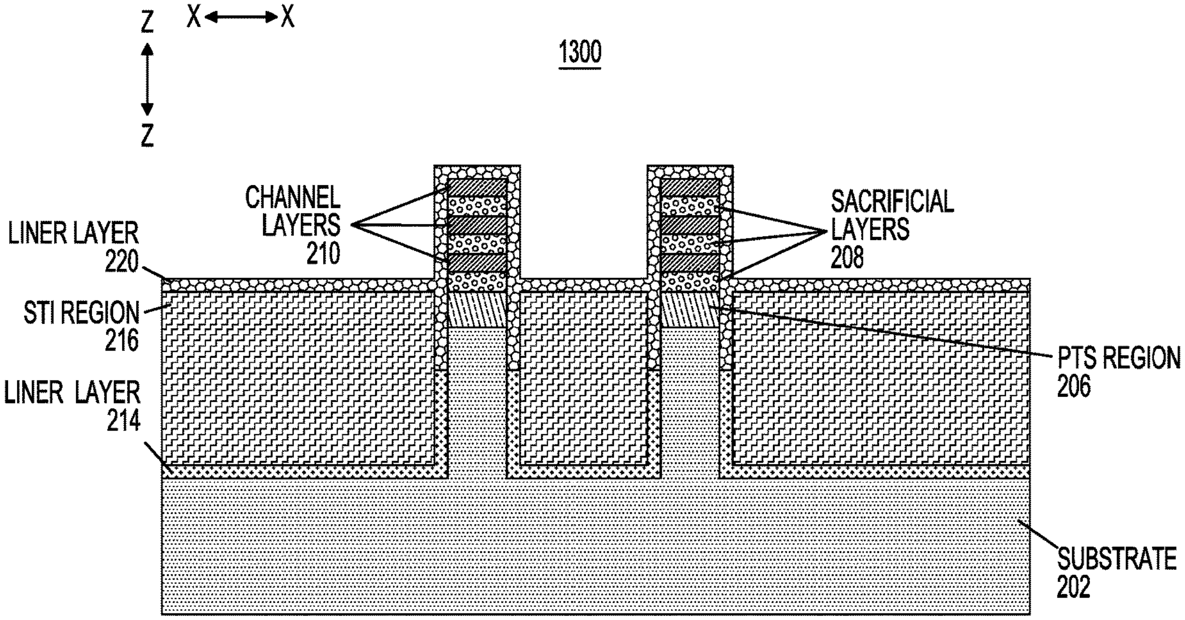
FIG. 13A depicts a first cross-sectional view of the structure FIGS. 12A and 12B following formation of an additional liner layer, according to an embodiment of the invention.
Figure 13B:
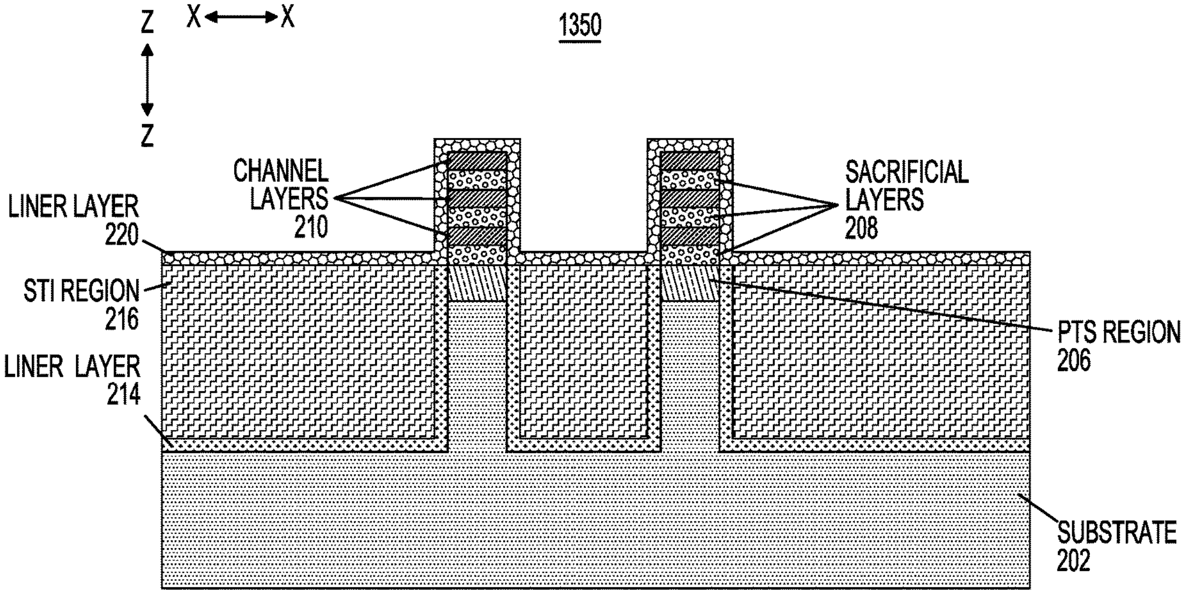
FIG. 13B depicts a second cross-sectional view of the structure of FIGS. 12A and 12B following the formation of the additional liner layer, according to an embodiment of the invention.

FIGS. 13A and 13B show first and second cross-sectional views 1300 and 1350 of the structure of FIGS. 12A and 12B following formation of a liner layer 220. The liner layer 220 may be formed of $SiO_2$ or doped $SiO_2$ (e.g., having a negative charge, such as BSG). The liner layer 220 may have a thickness in the range of 3 to 10 nm. As shown, the liner layer 220 fills in the regions exposed by the directional etch of the liner layer 214 (e.g., the liner layer surrounds the sidewalls of the PTS region 206 and the exposed portions of the underlying fins of the substrate 202) in the first region shown in FIG. 13A where the NFET devices will be formed. The liner layer 220 also covers the top surface of the STI region 216 and the patterned nanosheet stack in both the first region shown in FIG. 13A where NFET devices will be formed and the second region shown in FIG. 13B where PFET devices will be formed.

Figure 14A:
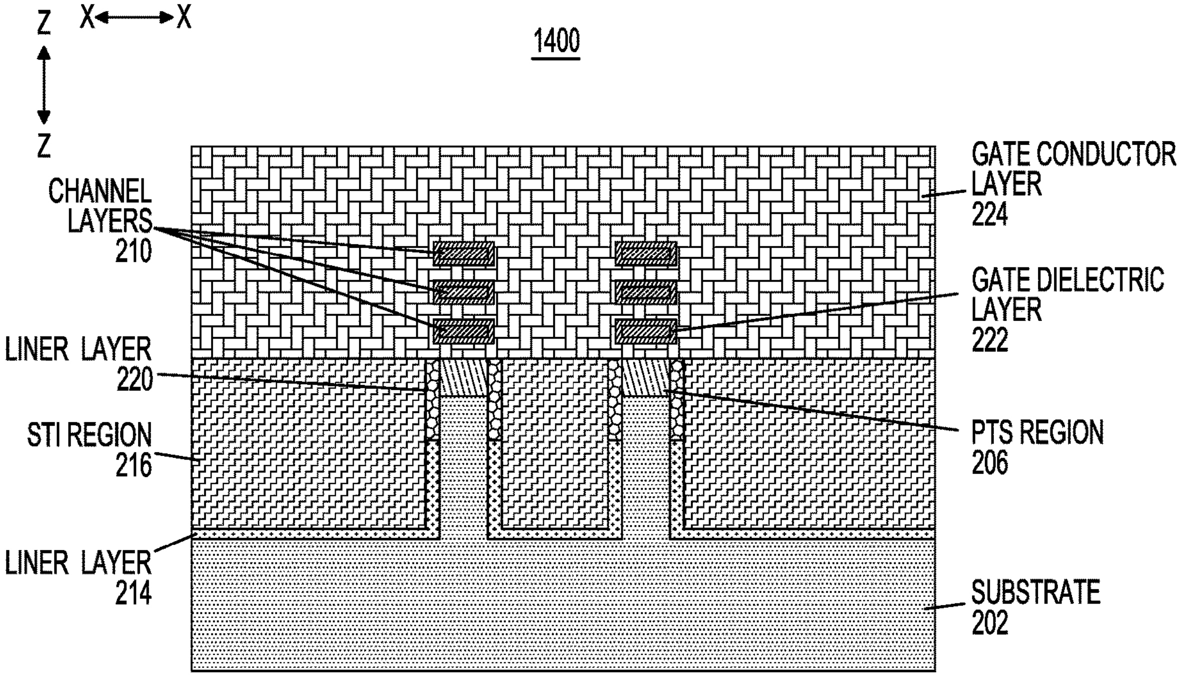
FIG. 14A depicts a first cross-sectional view of the structure FIGS. 13A and 13B following formation of a gate stack, according to an embodiment of the invention.
Figure 14B:
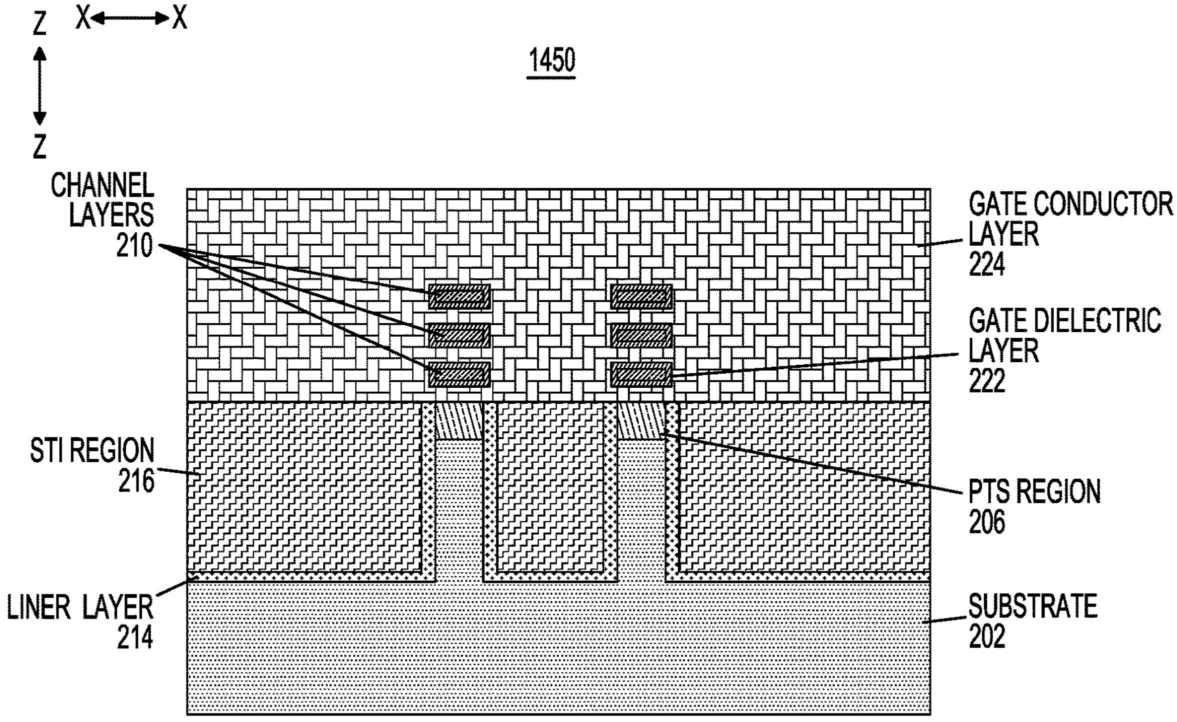
FIG. 14B depicts a second cross-sectional view of the structure of FIGS. 13A and 13B following the formation of the gate stack, according to an embodiment of the invention.
Figure 14C:
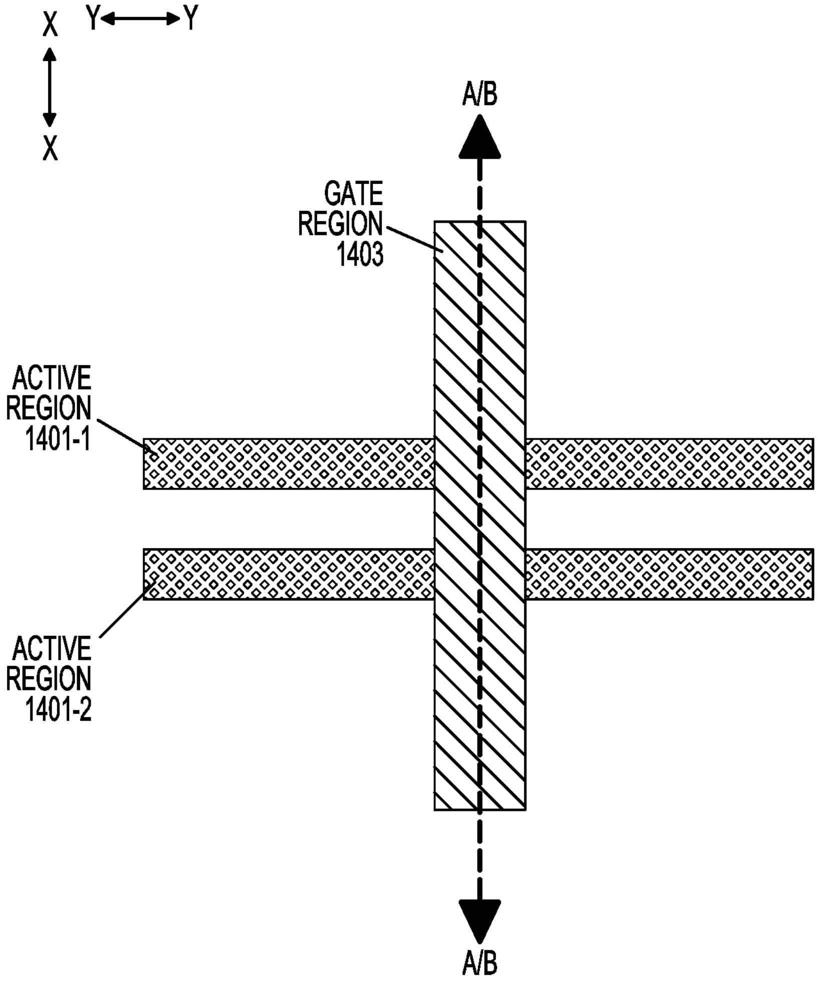
FIG. 14C depicts a top-down view showing where the first and second cross-sectional views of FIG. 14A and FIG. 14B are taken, according to an embodiment of the invention.

FIGS. 14A and 14B show first and second cross-sectional views 1400 and 1450 of the structure of FIGS. 13A and 13B following replacement metal gate processing (RMG) which forms a gate stack including a gate dielectric layer 222 and a gate conductor layer 224. FIG. 14C shows a top-down view 1475, illustrating where the first and second cross-sectional views 1400 and 1450 of FIGS. 14A and 14B are taken. The top-down view 1475 shows active regions 1401-1 and 1401-2 (collectively, active regions 1401) and a gate region 1403. The first cross-sectional view 1400 of FIG. 14A (and, similarly, the first cross-sectional views 1100, 1200 and 1300 of FIGS. 11A, 12A and 13A) are taken along the gate region 1403 in areas or regions of the structure where NFET devices are formed. The second cross-sectional view 1450 of FIG. 14B (and, similarly, the second cross-sectional views 1150, 1250 and 1350 of FIGS. 11B, 12B and 13B) are taken along the gate region 1403 in areas or regions of the structure where PFET devices are formed.

The gate dielectric layer 222, also referred to as a gate oxide, may be conformally deposited in the structure, and may be formed of a high-k material. Examples of high-k materials which may be used for the gate dielectric layer 222 include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layer 22 may have a uniform thickness in the range of 1 nm to 3 nm.

The gate conductor layer 224 may include a gate work function metal (WFM) layer and a gate metal layer. The gate WFM layer may be formed of a WFM such as titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. The gate WFM layer may have a uniform thickness in the range of 1 to 10 nm. The gate metal layer may comprise a conductive metal (e.g., tungsten (W)).

Figure 15A:
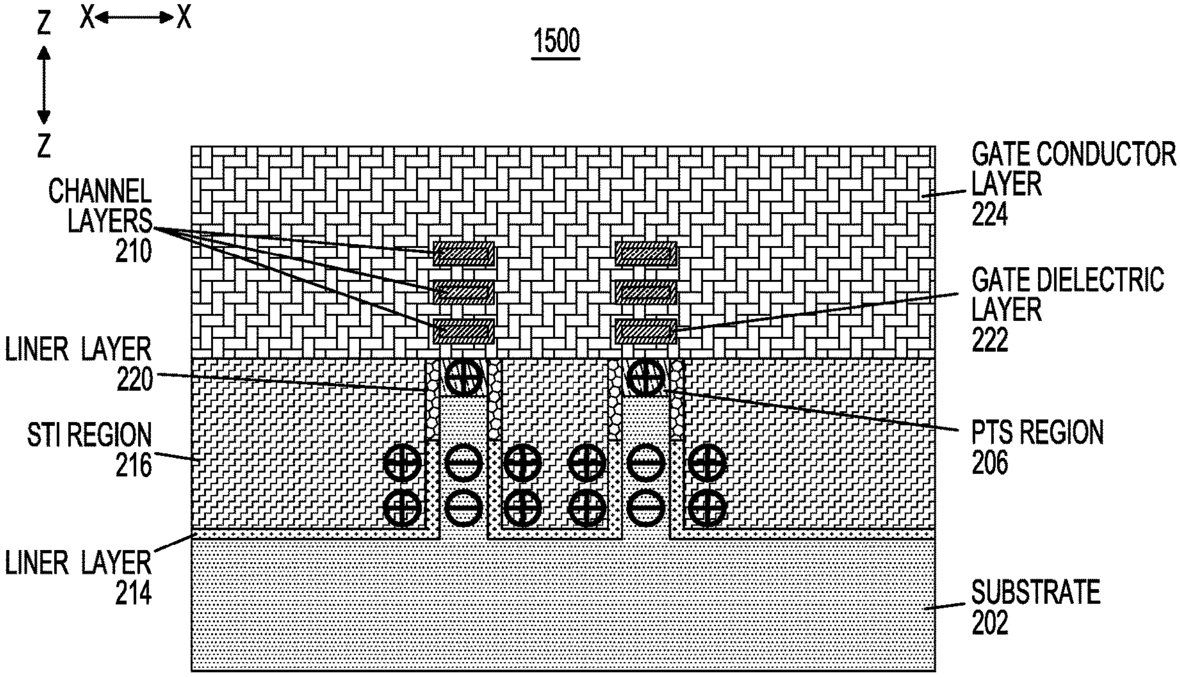
FIG. 15A depicts the cross-sectional view of FIG. 14A illustrating an absence of positive defect charges in the additional liner layer surrounding the punch through stop region, according to an embodiment of the invention.
Figure 15B:
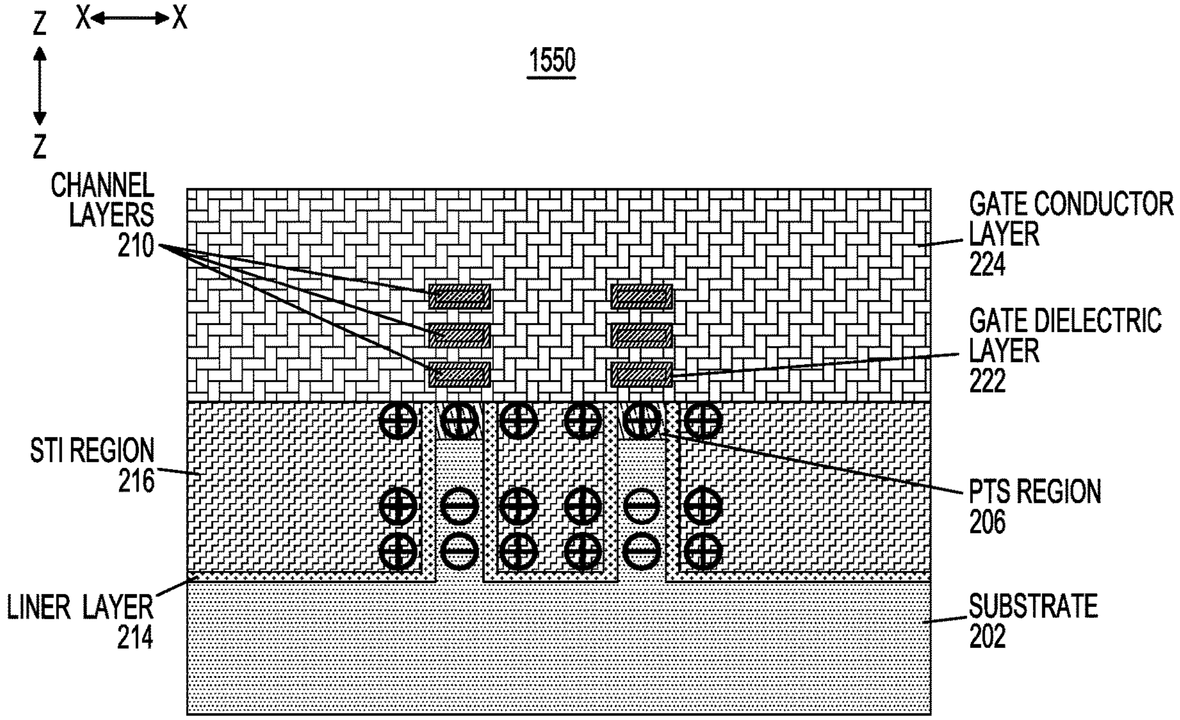
FIG. 15B depicts a cross-sectional view of a semiconductor structure having positive defect charges in a liner layer surrounding a punch through stop region, according to an embodiment of the invention.

FIG. 15A shows a cross-sectional view 1500 of the structure of FIG. 14A, illustrating inherent positive defect charges in the liner layer 214 (e.g., formed of SiN) and attracted negative charges in the portions of the fins of the substrate 202 which are surrounded by the liner layer 214. Advantageously, the liner layer 220 (e.g., formed of $SiO_2$) does not have the inherent positive defect charges, and thus does not prevent or minimize the punch through leakage provided by the PTS region 206 in the regions where NFET devices are formed. FIG. 15B shows a cross-sectional view 1550 of a semiconductor structure which is similar to the structure of FIG. 15A, but where the liner layer 214 remains on sidewalls of the PTS region 206. Here, the portions of the liner layer 214 on sidewalls of the PTS region 206 have the inherent positive defect charges, which prevents or minimizes the punch through leakage provided by the PTS region 206 in the regions where NFET devices are formed.

Figure 16A:
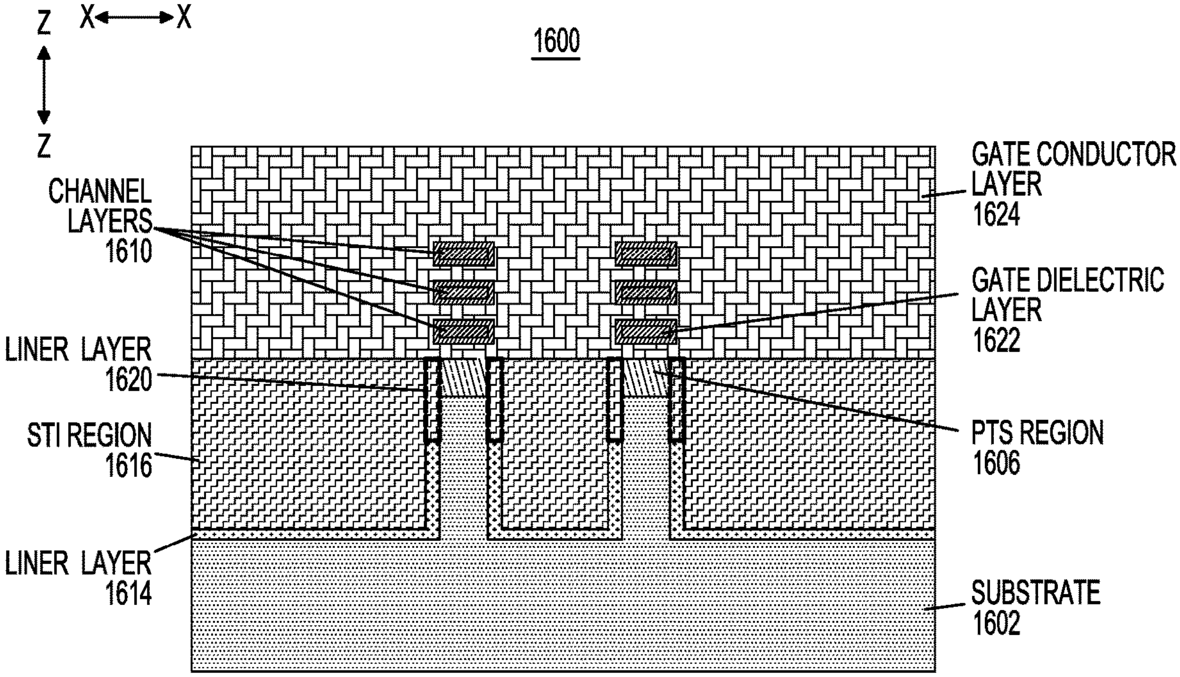
FIG. 16A depicts a first cross-sectional view of a first region of a semiconductor structure having nanosheet channel layers with an undoped additional liner layer surrounding a punch through stop region below the nanosheet channel layers, according to an embodiment of the invention.
Figure 16B:
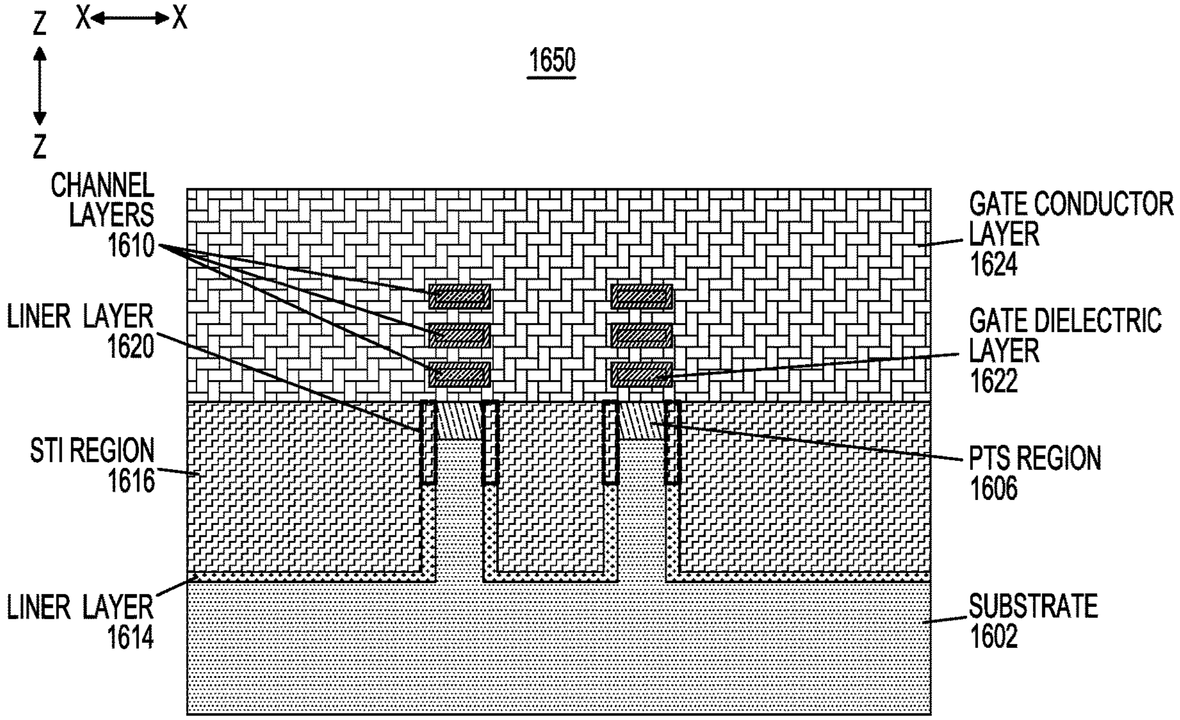
FIG. 16B depicts a second cross-sectional view of a second region of the semiconductor having the nanosheet channel layers with the undoped liner layer surrounding the punch through stop region below the nanosheet channel layers, according to an embodiment of the invention.

FIGS. 16A and 16B show first and second cross-sectional views 1600 and 1650 of first and second regions of a semiconductor structure including a substrate 1602, PTS region 1606, channel layers 1610, liner layer 1614, STI region 1616, liner layer 1620, gate dielectric layer 1622 and gate conductor layer 1624. The substrate 1602, PTS region 1606, channel layers 1610, STI region 1616, gate dielectric layer 1622 and gate conductor layer 1624 are formed using similar processing, and with similar sizing and materials as the substrate 202, PTS region 206, channel layers 210, STI region 216, gate dielectric layer 222 and gate conductor layer 224, respectively.

In the structure of FIGS. 16A and 16B, the liner layer 1614 is initially formed in a manner similar to that described above with respect to the liner layer 214 in FIG. 7. However, rather than recessing liner layer 1614 only in the regions or areas where NFET devices are formed, the liner layer 1614 is recessed both in regions or areas where NFET devices are formed (e.g., the first region shown in FIG. 16A) and in regions or areas where PFET devices are formed (e.g., the second region shown in FIG. 16B). Thus, the OPL 218 is not patterned as shown in FIGS. 11A and 11B, and the directional etch recesses the liner layer 1614 in both the first region shown in FIG. 16A and the second region shown in FIG. 16B. The liner layer 1620 is formed in a manner similar to that described above with respect to the liner layer 220 in FIGS. 13A and 13B, though as the liner layer 1614 is recessed in both the first region shown in FIG. 16A and the second region shown in FIG. 16B, the liner layer 1620 fills the recessed regions and surrounds the PTS region 206 and a portion of the underlying fins of the substrate 202 in both the first region shown in FIG. 16A and the second region shown in FIG. 16B. The liner layer 1620 may be formed of undoped $SiO_2$, and is shown in dashed outline in FIGS. 16A and 16B (e.g., as it is the same material as the surrounding STI region 216, also formed of undoped $SiO_2$).

Figure 17A:
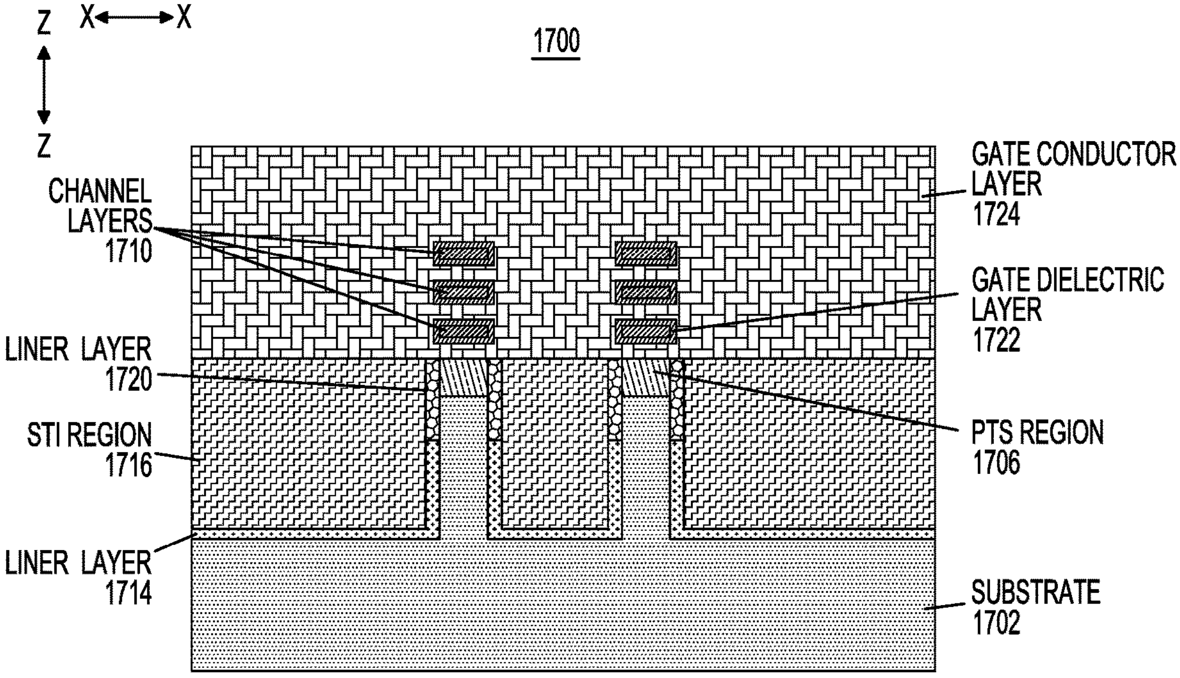
FIG. 17A depicts a first cross-sectional view of a first region of a semiconductor structure having nanosheet channel layers with a first doped liner layer surrounding a punch through stop region below the nanosheet channel layers, according to an embodiment of the invention.
Figure 17B:
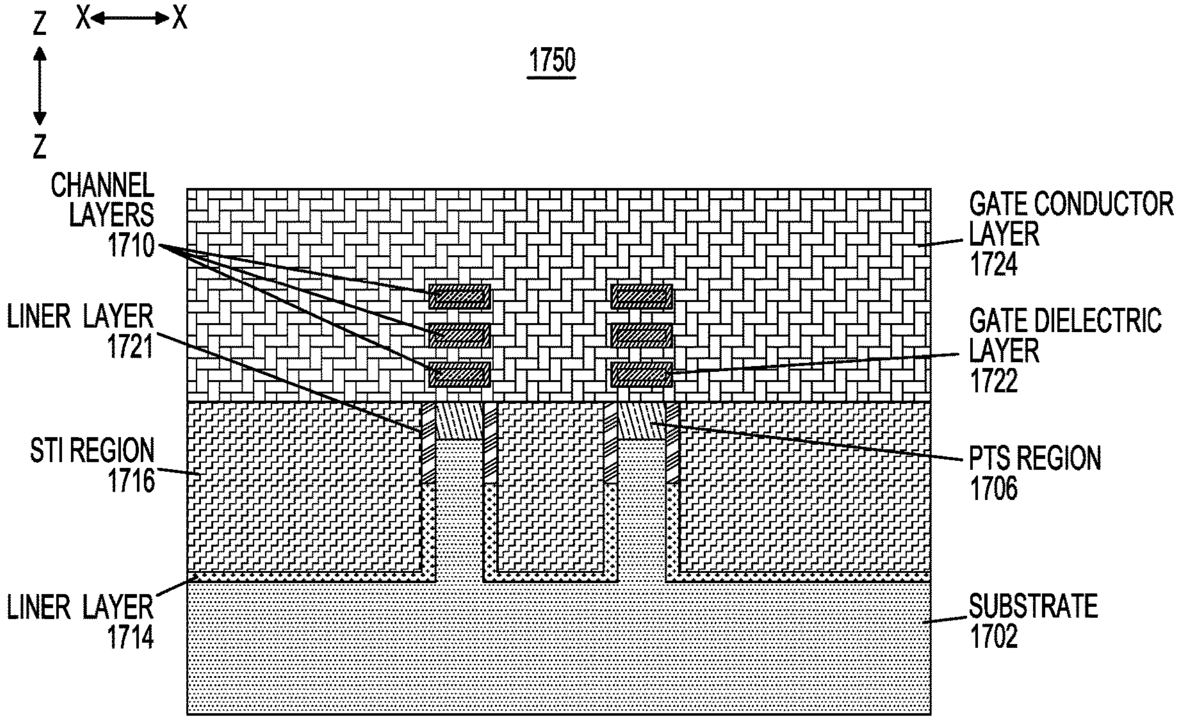
FIG. 17B depicts a second cross-sectional view of a second region of the semiconductor structure having the nanosheet channel layers with a second doped liner layer surrounding the punch through stop region below the nanosheet channel layers, according to an embodiment of the invention.

FIGS. 17A and 17B show first and second cross-sectional views 1700 and 1750 of first and second regions of a semiconductor structure including a substrate 1702, PTS region 1706, channel layers 1710, liner layer 1714, STI region 1716, liner layer 1720, liner layer 1721, gate dielectric layer 1722 and gate conductor layer 1724. The substrate 1702, PTS region 1706, channel layers 1710, STI region 1716, gate dielectric layer 1722 and gate conductor layer 1724 are formed using similar processing, and with similar sizing and materials as the substrate 202, PTS region 206, channel layers 210, STI region 216, gate dielectric layer 222 and gate conductor layer 224, respectively.

In the structure of FIGS. 17A and 17B, the liner layer 1714 is initially formed in a manner similar to that described above with respect to the liner layer 214 in FIG. 7. However, rather than recessing liner layer 1714 only in the regions or areas where NFET devices are formed, the liner layer 1714 is recessed both in regions or areas where NFET devices are formed (e.g., the first region shown in FIG. 17A) and in regions or areas where PFET devices are formed (e.g., the second region shown in FIG. 17B). Thus, the OPL 218 is not patterned as shown in FIGS. 11A and 11B, and the directional etch recesses the liner layer 1714 in both the first region shown in FIG. 17A and the second region shown in FIG. 17B. The liner layers 1720 and 1721 are formed in separate steps. To form the liner layer 1720, a mask layer (e.g., an OPL) is patterned to cover the second region shown in FIG. 17B, followed by deposition of a material for the liner layer 1720 and removal of the mask layer. The liner layer 1720, for example, may comprise doped $SiO_2$ having a negative charge (e.g., BSG). To form the liner layer 1721, a mask layer (e.g., an OPL) is patterned to cover the first region shown in FIG. 17A, followed by deposition of a material for the liner layer 1721 and removal of the mask layer. The liner layer 1721, for example, may comprise doped $SiO_2$ having a positive charge (e.g., PSG). The liner layer 1720 and the liner layer 1721 may be formed in either order (e.g., the liner layer 1720 first or the liner layer 1721 first). As a result, the PTS region 206 in areas where the NFET devices are formed is surrounded by the liner layer 1720 (e.g., having a negative charge) while the PTS region 206 in areas where the PFET devices are formed is surrounded by the liner layer 1721 (e.g., having a positive charge). This improves punch through leakage performance of the PTS region 206 for both NFET and PFET devices.

As noted above, while FIGS. 5-17B show process flows and structures which include nanosheet transistor devices, embodiments are not limited to structures which include nanosheet transistor devices. FIGS. 18A-20B show structures which include FinFET transistor devices. The structure shown in FIGS. 18A and 18B corresponds generally to the structure shown in FIGS. 14A and 14B (e.g., where the liner layer 220 surrounds the PTS region 206 in areas where NFET devices are formed, and the liner layer 214 surrounds the PTS region 206 in areas where PFET devices are formed), the structure shown in FIGS. 19A and 19B corresponds generally to the structure shown in FIGS. 16A and 16B (e.g., where the liner layer 1620 surrounds the PTS region 206 both in areas where NFET devices are formed and in areas where PFET devices are formed), and the structure shown in FIGS. 20A and 20B corresponds generally to the structure shown in FIGS. 17A and 17B (e.g., where the liner layer 1720 surrounds the PTS region 206 in areas where NFET devices are formed and the liner layer 1721 surrounds the PTS region 206 in areas where PFET devices are formed).

Figure 18A:
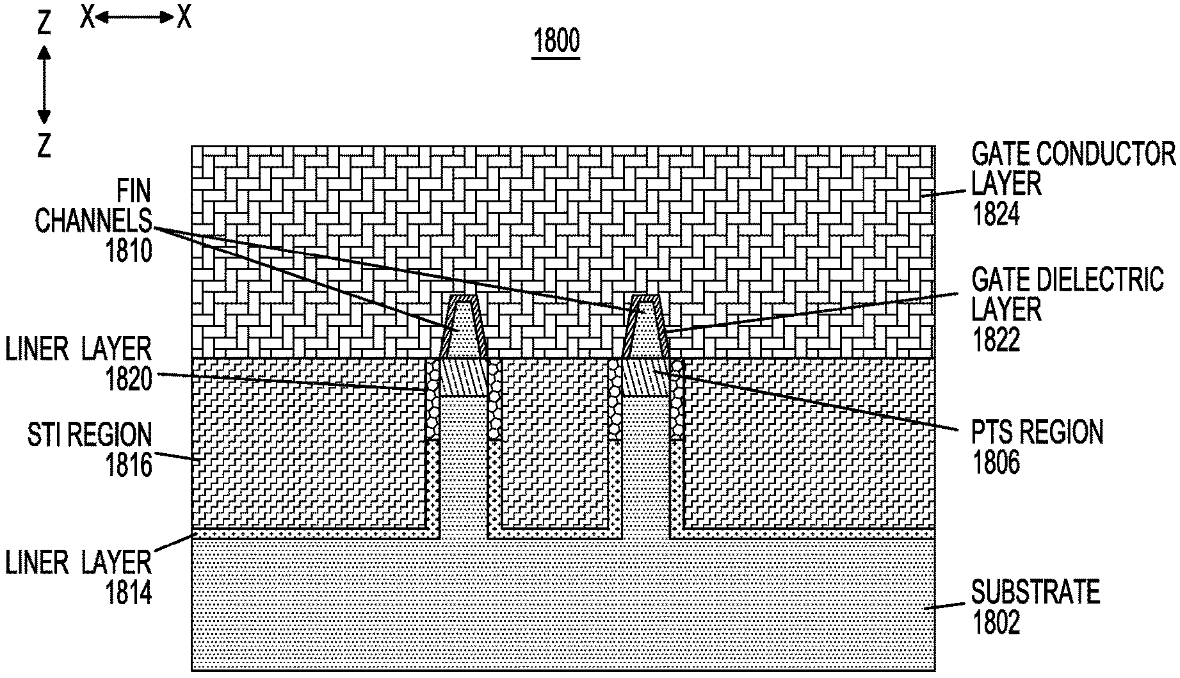
FIG. 18A depicts a first cross-sectional view of a first region of a semiconductor structure having fin channels with a doped liner layer surrounding a punch through stop region below the fin channels, according to an embodiment of the invention.
Figure 18B:
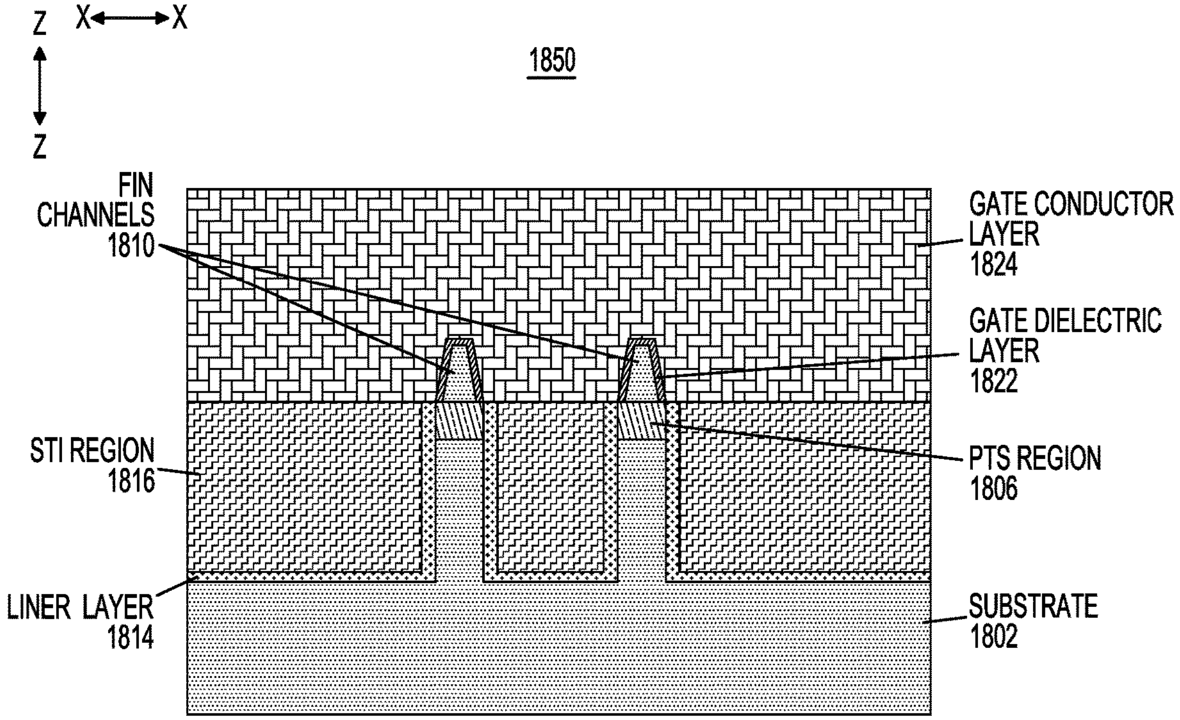
FIG. 18B depicts a second cross-sectional view of a second region of the semiconductor structure having the fin channels without the doped liner surrounding the punch through stop region below the fin channels, according to an embodiment of the invention.

FIGS. 18A and 18B show first and second cross-sectional views 1800 and 1850 of first and second regions of a semiconductor structure including a substrate 1802, PTS region 1806, fin channels 1810, liner layer 1814, STI region 1816, liner layer 1820, gate dielectric layer 1822 and gate conductor layer 1824. The substrate 1802, PTS region 1806, liner layer 1814, STI region 1816 and liner layer 1820 are formed using similar processing, and with similar sizing and materials as the substrate 202, PTS region 206, liner layer 214, STI region 216 and liner layer 220, respectively. Here, however, rather than forming and patterning a nanosheet stack (as shown in FIGS. 5 and 6), the fin channels 1810 are formed and patterned over the PTS region 1806. The fin channels 1810 may be formed of Si or another suitable material (e.g., similar materials as the channel layers 210). The fin channels 1810 may have widths (in direction X) in the range of 10 to 100 nm, and may have heights (in direction Z) in the range of 30 to 80 nm. The gate dielectric layer 1822 is formed to surround the fin channels 1810, and the gate conductor layer 1824 is formed over the gate dielectric layer 1822. The gate dielectric layer 1822 and the gate conductor layer 1824 may be formed of similar materials and with similar sizing as the gate dielectric layer 222 and the gate conductor layer 224, respectively.

Figure 19A:
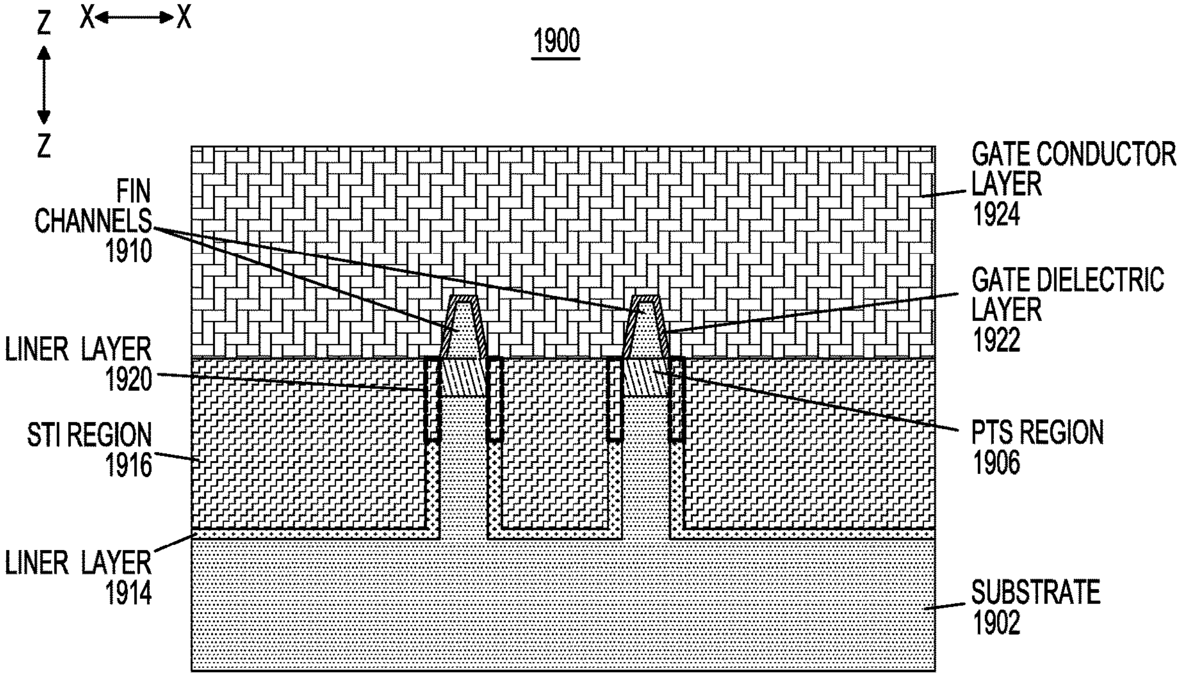
FIG. 19A depicts a first cross-sectional view of a first region of a semiconductor structure having fin channels with an undoped liner layer surrounding a punch through stop region below the fin channels, according to an embodiment of the invention.
Figure 19B:
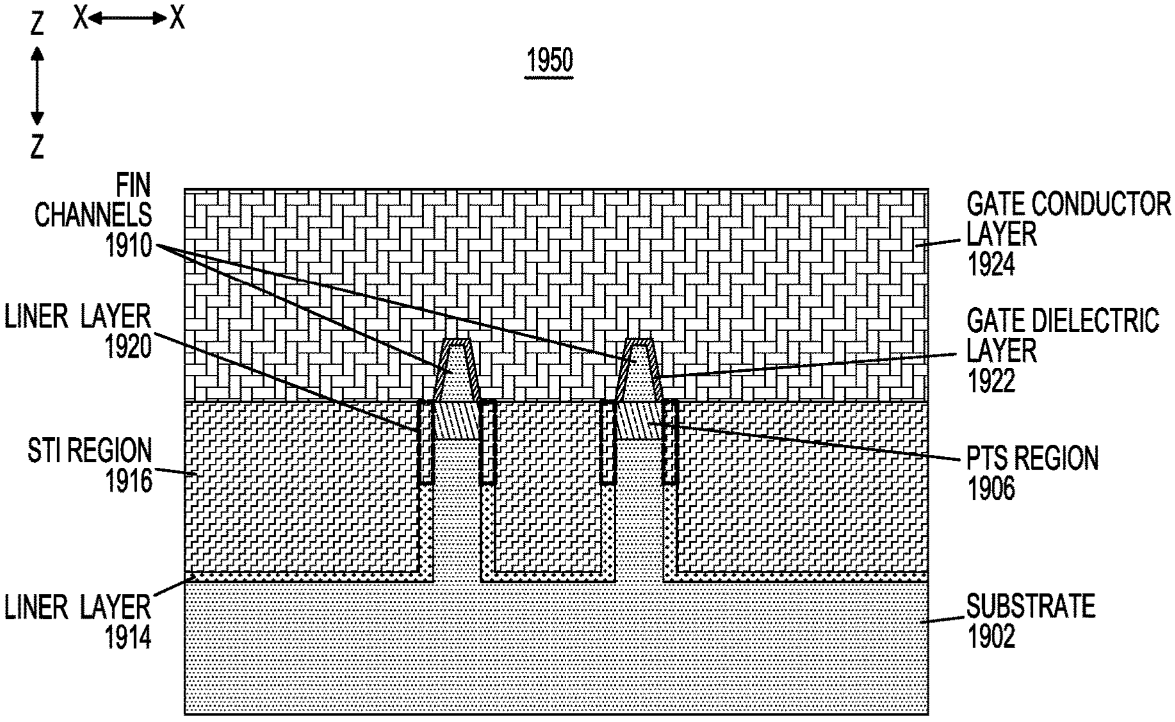
FIG. 19B depicts a second cross-sectional view of a second region of the semiconductor structure having the fin channels with the undoped liner layer surrounding the punch through stop region below the fin channels, according to an embodiment of the invention.

FIGS. 19A and 19B show first and second cross-sectional views 1900 and 1950 of first and second regions of a semiconductor structure including a substrate 1902, PTS region 1906, fin channels 1910, liner layer 1914, STI region 1916, liner layer 1920, gate dielectric layer 1922 and gate conductor layer 1924. The substrate 1902, PTS region 1906, liner layer 1914, STI region 1916 and liner layer 1920 are formed using similar processing, and with similar sizing and materials as the substrate 1602, PTS region 1606, liner layer 1614, STI region 1616 and liner layer 1620, respectively.

Here, however, rather than forming and patterning a nanosheet stack (as shown in FIGS. 5 and 6), the fin channels 1910 are formed and patterned over the PTS region 1906. The fin channels 1910, the gate dielectric layer 1922 and the gate conductor layer 1924 may be formed of similar materials and with similar sizing and processing as that described above with respect to the fin channels 1810, the gate dielectric layer 1822 and the gate conductor layer 1824, respectively.

Figure 20A:
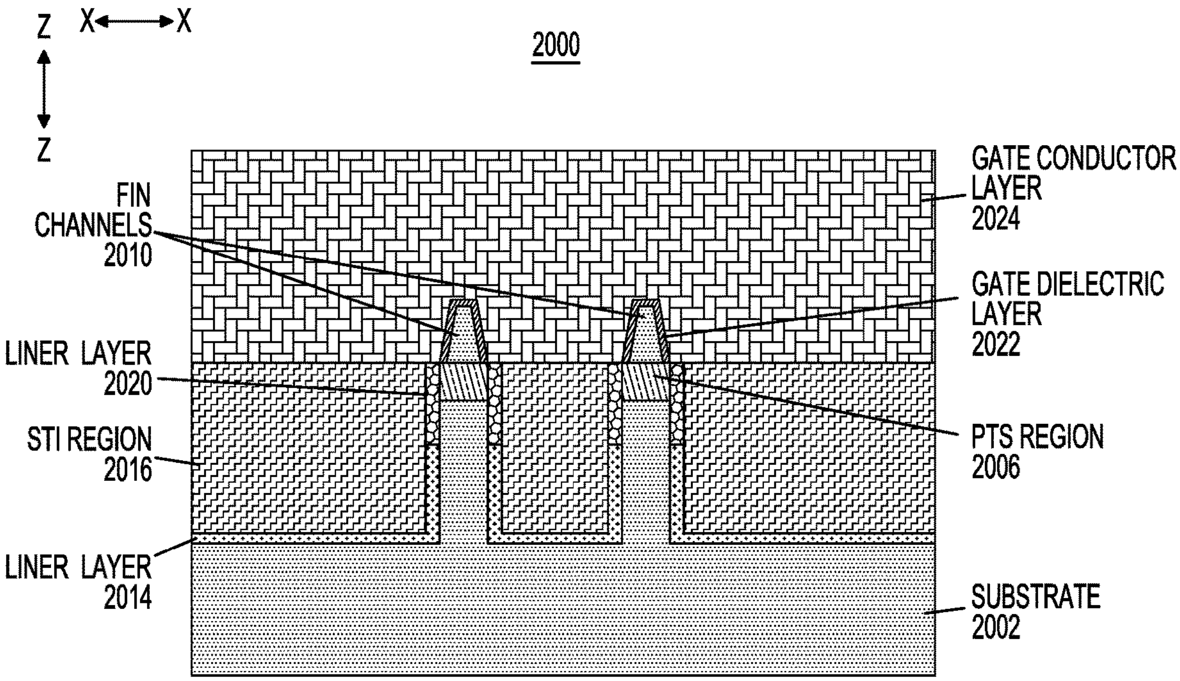
FIG. 20A depicts a first cross-sectional view of a first region of a semiconductor structure having fin channels with a first doped liner layer surrounding a punch through stop region below the fin channels, according to an embodiment of the invention.
Figure 20B:
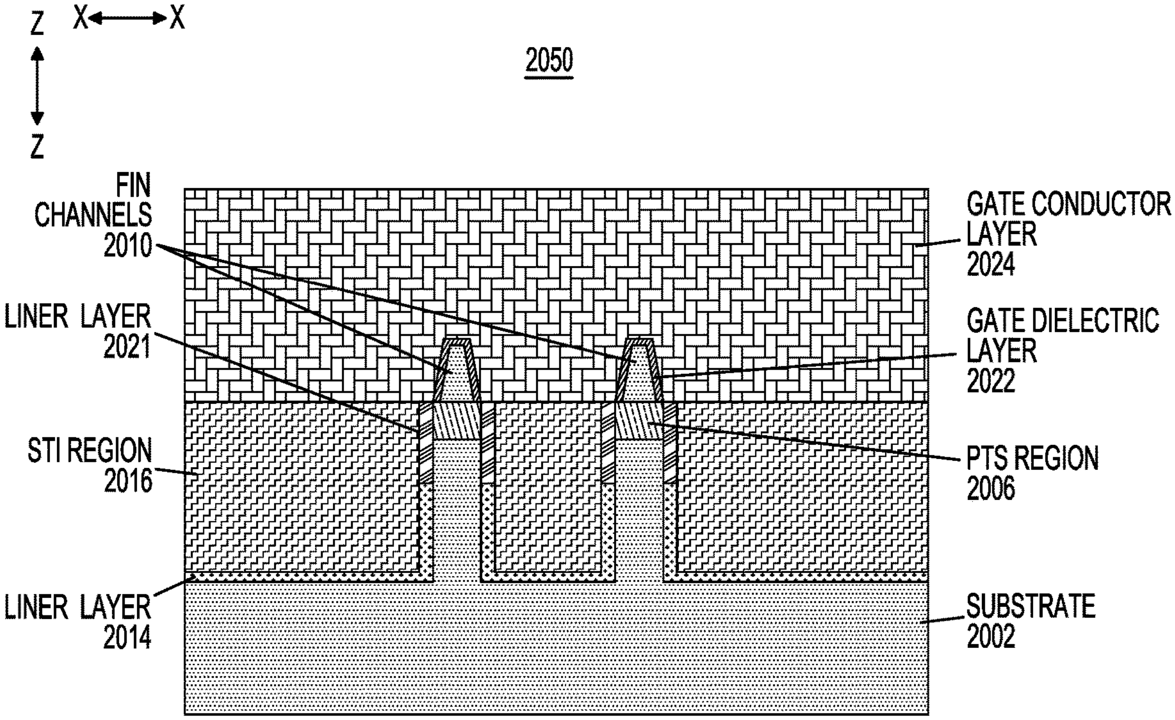
FIG. 20B depicts a second cross-sectional view of a second region of the semiconductor structure having the fin channels with a second doped liner layer surrounding the punch through stop region below the fin channels, according to an embodiment of the invention.

FIGS. 20A and 20B show first and second cross-sectional views 2000 and 2050 of first and second regions of a semiconductor structure including a substrate 2002, PTS region 2006, fin channels 2010, liner layer 2014, STI region 2016, liner layer 2020, liner layer 2021, gate dielectric layer 2022 and gate conductor layer 2024. The substrate 2002, PTS region 2006, liner layer 2014, STI region 2016, line layer 2020 and liner layer 2021 are formed using similar processing, and with similar sizing and materials as the substrate 1702, PTS region 1706, liner layer 1714, STI region 1716, liner layer 1720 and liner layer 1721, respectively. Here, however, rather than forming and patterning a nanosheet stack (as shown in FIGS. 5 and 6), the fin channels 2010 are formed and patterned over the PTS region 2006. The fin channels 2010, the gate dielectric layer 2022 and the gate conductor layer 2024 may be formed of similar materials and with similar sizing and processing as that described above with respect to the fin channels 1810, the gate dielectric layer 1822 and the gate conductor layer 1824, respectively.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductor (CMOS) transistors, metal-oxide-semiconductor field-effect transistors (MOSFETs), and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Figure 21:
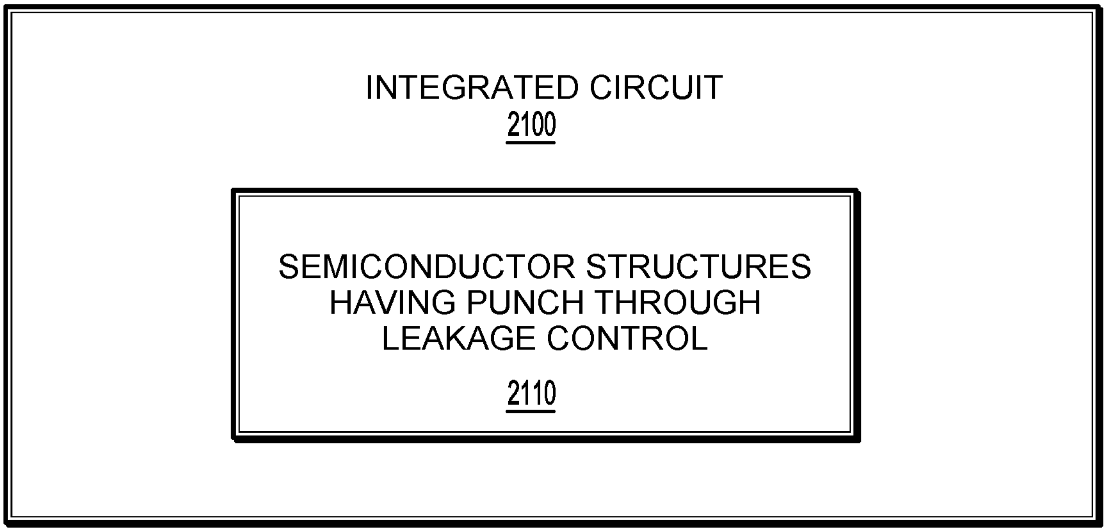
FIG. 21 shows an integrated circuit comprising one or more semiconductor structures with punch through leakage control, according to an embodiment of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 21 shows an example integrated circuit 2100 which includes one or more semiconductor structures 2110 with punch through leakage control.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:

a semiconductor layer;

one or more channel layers disposed over the semiconductor layer;

a first dielectric liner surrounding sidewalls of a first region of the semiconductor layer proximate the one or more channel layers;

a second dielectric liner (i) surrounding sidewalls of a second region of the semiconductor layer below the first region of the semiconductor layer and (ii) not surrounding the sidewalls of the first region of the semiconductor layer proximate the one or more channel layers; and a shallow trench isolation region surrounding the first dielectric liner and the second dielectric liner;

wherein the first dielectric liner and the second dielectric liner are different materials.

2. The semiconductor structure of claim 1, wherein the first dielectric liner, the second dielectric liner and the shallow trench isolation region are different materials.

3. The semiconductor structure of claim 1, wherein the first dielectric liner and the shallow trench isolation region are the same material.

4. The semiconductor structure of claim 1, wherein the first dielectric liner comprises silicon dioxide and the second dielectric liner comprises silicon nitride.

5. The semiconductor structure of claim 4, wherein the first dielectric liner comprises doped silicon dioxide.

6. The semiconductor structure of claim 4, wherein the at least one channel layer is for an n-type transistor device, and wherein the first dielectric liner comprises doped silicon dioxide having a negative charge.

7. The semiconductor structure of claim 6, wherein the first dielectric liner comprises borosilicate glass.

8. The semiconductor structure of claim 4, wherein the at least one channel layer is for a p-type transistor device, and wherein the first dielectric liner comprises doped silicon dioxide having a positive charge.

9. The semiconductor structure of claim 8, wherein the first dielectric liner comprises phosphosilicate glass.

10. The semiconductor structure of claim 1, wherein the first region of the semiconductor layer comprises a punch through stop region.

11. The semiconductor structure of claim 1, wherein the one or more channel layers comprise nanosheet channel layers for a nanosheet transistor device.

12. The semiconductor structure of claim 1, wherein the one or more channel layers comprise a fin channel for a fin field-effect transistor device.

13. A semiconductor structure comprising:

a first semiconductor layer;

one or more first channel layers for an n-type transistor device disposed over the first semiconductor layer;

a second semiconductor layer;

one or more second channel layers for a p-type transistor device disposed over the second semiconductor layer;

a first dielectric liner surrounding sidewalls of a first region of the first semiconductor layer proximate the one or more first channel layers;

a second dielectric liner surrounding sidewalls of a first region of the second semiconductor layer proximate the one or more second channel layers;

a third dielectric liner (i) surrounding sidewalls of second regions of the first and second semiconductor layers below the first regions of the first and second semiconductor layers (ii) not surrounding the sidewalls of the first region of the first semiconductor layer proximate the one or more first channel layers, and (iii) not surrounding the sidewalls of the first region of the second semiconductor layer proximate the one or more second channel layers; and a shallow trench isolation region surrounding the first dielectric liner, the second dielectric liner and the third dielectric liner;

wherein the first dielectric liner and the third dielectric liner are different materials.

14. The semiconductor structure of claim 13, wherein the first dielectric liner and the second dielectric liner are different materials.

15. The semiconductor structure of claim 13, wherein the first dielectric liner and the second dielectric liner are the same material.

16. The semiconductor structure of claim 13, wherein the first dielectric liner and the second dielectric liner comprises silicon dioxide, and wherein the third dielectric liner comprises silicon nitride.

17. An integrated circuit comprising:

a semiconductor structure comprising:

a semiconductor layer;

one or more channel layers disposed over the semiconductor layer;

a first dielectric liner surrounding sidewalls of a first region of the semiconductor layer proximate the one or more channel layers;

a second dielectric liner (i) surrounding sidewalls of a second region of the semiconductor layer below the first region of the semiconductor layer and (ii) not surrounding the sidewalls of the first region of the semiconductor layer proximate the one or more channel layers; and a shallow trench isolation region surrounding the first dielectric liner and the second dielectric liner;

wherein the first dielectric liner and the second dielectric liner are different materials.

18. The integrated circuit of claim 17, wherein the first dielectric liner, the second dielectric liner and the shallow trench isolation region are different materials.

19. The integrated circuit of claim 17, wherein the first dielectric liner and the shallow trench isolation region are the same material.

20. The integrated circuit of claim 17, wherein the first dielectric liner comprises silicon dioxide and the second dielectric liner comprises silicon nitride.

* * * * *